US012727374B2

(12) United States Patent
Kim et al.

(10) Patent No.: US 12,727,374 B2
(45) Date of Patent: Sep. 1, 2026

(54) METHOD OF MANUFACTURING DISPLAY DEVICE AND DISPLAY DEVICE MANUFACTURED THEREBY

(71) Applicant: Samsung Display Co., LTD., Yongin-si (KR)

(72) Inventors: Sikwang Kim, Seongnam-si (KR); Woongsik Kim, Seoul (KR); Donghwan Bae, Seoul (KR); Jin-Su Byun, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 595 days.

(21) Appl. No.: 18/142,859

(22) Filed: May 3, 2023

(65) Prior Publication Data

US 2024/0049586 A1 Feb. 8, 2024

(30) Foreign Application Priority Data

Aug. 2, 2022 (KR) ........................ 10-2022-0095891

(51) Int. Cl.
*H10K 59/80* (2023.01)
*H10K 71/80* (2023.01)

(52) U.S. Cl.
CPC ........... *H10K 71/80* (2023.02); *H10K 59/873* (2023.02); *H10K 59/8791* (2023.02)

(58) Field of Classification Search
CPC ............. H10K 59/8792; H10K 59/126; H10K 59/875; H10K 59/865; H10K 59/8791; G02F 1/133524; G02F 1/133607; G02B 2207/123; G02B 5/003; G02B 5/22
See application file for complete search history.

(56) References Cited

U.S. PATENT DOCUMENTS 10,991,595 B1 * 4/2021 Chang .................. H10P 50/242
2010/0271721 A1 10/2010 Gaides et al.
2020/0168844 A1 * 5/2020 Kim .................... H10K 59/352
2023/0393312 A1 * 12/2023 Kenney ................. G02B 5/003

FOREIGN PATENT DOCUMENTS

CN 107742667 A 2/2018
KR 1020190099304 A 8/2019
KR 1020200063591 A 6/2020
KR 1020210092351 A 7/2021

* cited by examiner

*Primary Examiner* — Eric K Ashbahian
(74) *Attorney, Agent, or Firm* — CANTOR COLBURN LLP

(57) ABSTRACT

A method of manufacturing a display device includes forming an organic layer on an encapsulation layer disposed on a light emitting layer, forming a slit layer on the organic layer, where a slit exposing at least a portion of a top surface of the organic layer is formed in the slit layer, forming a first trench by performing a primary etching on the organic layer by using the slit layer as a mask, forming a first inorganic protective layer covering a side surface of the first trench, forming a second trench extending from the first trench by performing a secondary etching on the organic layer by using the slit layer as a mask, and forming a light blocking material filling the first trench and the second trench.

16 Claims, 20 Drawing Sheets

400
300
200
100
EVEN
DEP CD
L1
L2
10
30
40

FIG. 4

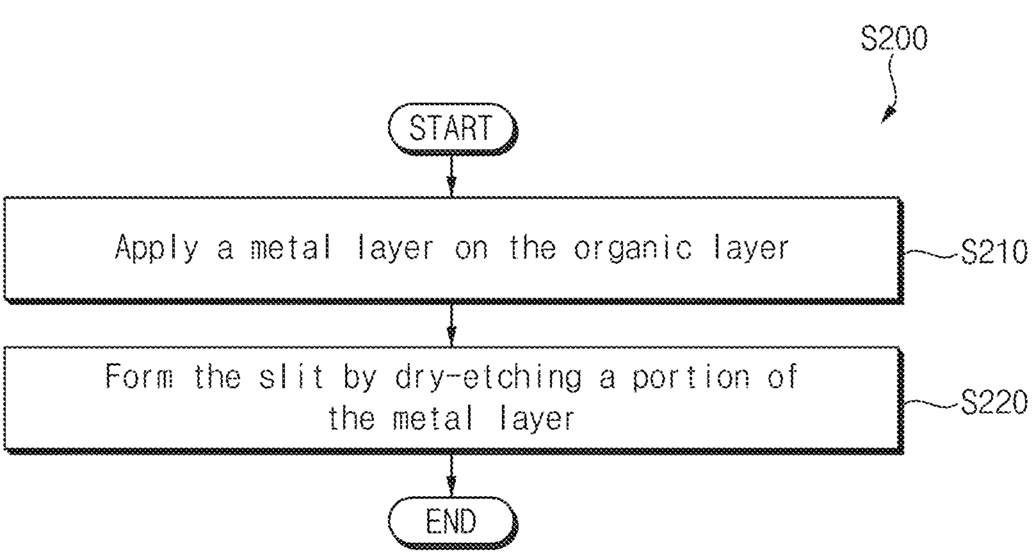

START

Form a preliminary first inorganic protective layer covering a top surface of the slit layer, the side surface of the first trench, and a bottom surface of the first trench

S410

Form the first inorganic protective layer by removing a portion of the preliminary first inorganic protective layer, which covers the top surface of the slit layer and the bottom surface of the first trench, by anisotropically dry-etching the preliminary first inorganic protective layer

S420

END

S100
FIG. 8
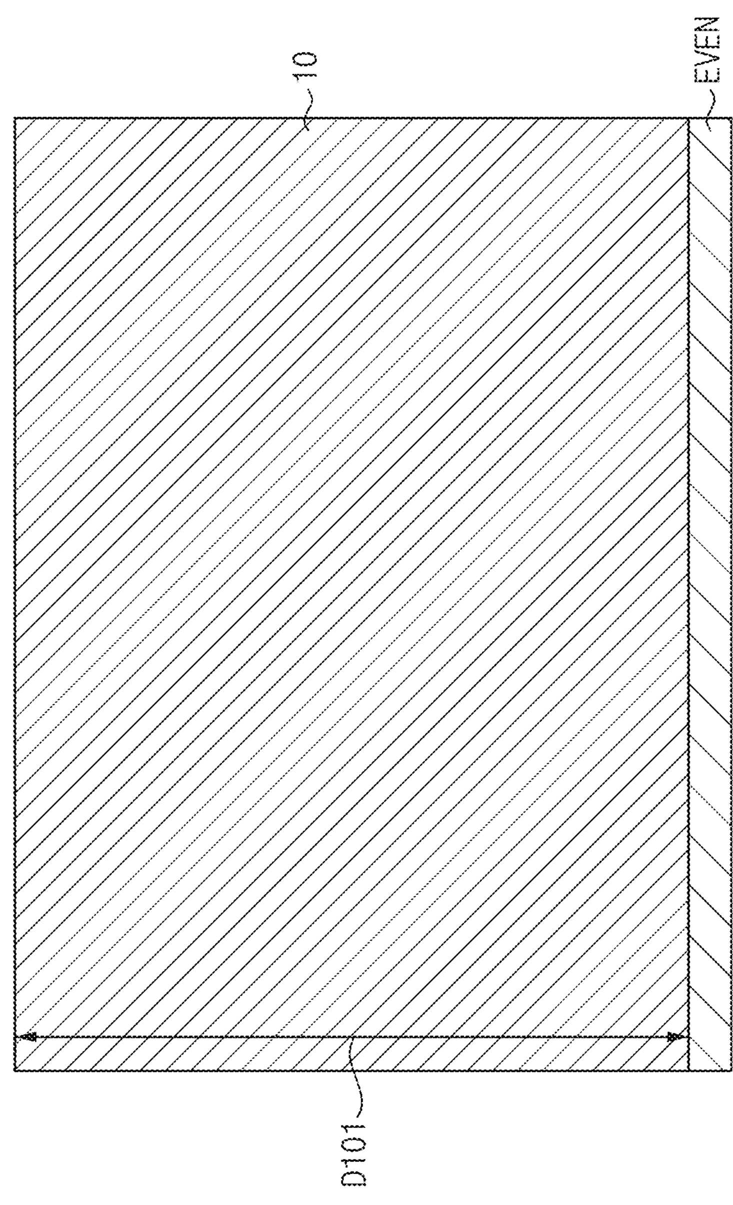
10
EVEN
D101

20
30
10
EVEN
HA1
HB1
HC1

FIG. 14

S500
20
30
10
EVEN
P2
HC1

20
30
32
10
EVEN
D411
HA1
HB1
HB2
HC2

FIG. 16

S420'
20
30
32
10
EVEN
D511
D512
HA
HC2

FIG. 17

S500'
20
30
32
10
EVEN
P3

EVEN

METHOD OF MANUFACTURING DISPLAY DEVICE AND DISPLAY DEVICE MANUFACTURED THEREBY

This application claims priority to Korean Patent Application No. 10-2022-0095891, filed on Aug. 2, 2022, and all the benefits accruing therefrom under 35 U.S.C. § 119, the content of which in its entirety is herein incorporated by reference.

BACKGROUND

1. Field

Embodiments provide generally to a method of manufacturing display device and a display device manufactured thereby.

2. Description of the Related Art

As information technology develops, the importance of a display device as a connection medium between a user and information is being highlighted. For example, the use of display devices such as a liquid crystal display device (LCD), an organic light emitting display device (OLED), a plasma display device (PDP), a quantum dot display device or the like is increasing.

SUMMARY

In a display device, although there is no restriction on a viewing angle, it may be desired to limit the viewing angle for reasons such as privacy protection.

Embodiments provide a method of manufacturing display device.

Embodiments provide a display device manufactured thereby.

An embodiment of a method of manufacturing a display device includes forming an organic layer on an encapsulation layer disposed on a light emitting layer; forming a slit layer on the organic layer, where a slit exposing at least a portion of a top surface of the organic layer is formed in the slit layer; forming a first trench by performing a primary etching on the organic layer by using the slit layer as a mask; forming a first inorganic protective layer covering a side surface of the first trench; forming a second trench extending from the first trench by performing a secondary etching on the organic layer by using the slit layer as a mask; and forming a light blocking material filling the first trench and the second trench.

In an embodiment, a thickness of the organic layer may be less than or equal to about micrometers (μm).

In an embodiment, the forming the slit layer may include applying a metal layer on the organic layer; and forming the slit by performing a dry-etching on a portion of the metal layer.

In an embodiment, the metal layer may include aluminum.

In an embodiment, each of the primary etching and the secondary etching may be a dry etching.

In an embodiment, the forming the first inorganic protective layer may include forming a preliminary first inorganic protective layer on the organic layer, on which the primary etching is performed, to cover a top surface of the slit layer, the side surface of the first trench, and a bottom surface of the first trench; and removing a portion of the preliminary first inorganic protective layer, which covers the top surface of the slit layer and the bottom surface of the first trench, by performing an anisotropic dry-etching on the preliminary first inorganic protective layer.

In an embodiment, the first inorganic protective layer may include a transparent material.

In an embodiment, a height of the first trench may be different from a height of the second trench.

In an embodiment, the height of the first trench may be greater than the height of the second trench.

In an embodiment, the method may further include removing the slit layer before the forming the light blocking material.

In an embodiment, the forming the light blocking material may include applying a light blocking material layer onto the organic layer to fill the first trench and the second trench; and removing a portion of the light blocking material layer disposed on a top surface of the organic layer.

An embodiment of a method of manufacturing a display device includes forming an organic layer on an encapsulation layer disposed on a light emitting layer; forming a slit layer on the organic layer, where a slit exposing at least a portion of a top surface of the organic layer is formed in the slit layer; forming a first trench by performing a primary etching on the organic layer by using the slit layer as a mask; forming a first inorganic protective layer covering a side surface of the first trench; forming a second trench extending from the first trench by performing a secondary etching on the organic layer by using the slit layer as a mask; forming an $(N-1)^{th}$ inorganic protective layer (where N is a natural number that is greater than or equal to 3) covering side surfaces of first to $(N-1)^{th}$ trenches, forming an $N^{th}$ trench extending from the $(N-1)^{th}$ trench by performing an $N^{th}$-degree-etching on the organic layer by using the slit layer as a mask, where forming an additional inorganic protective layer and forming an additional trench are repeatedly performed (N−2) times, respectively; and forming a light blocking material filling the first to $N^{th}$ trenches.

In an embodiment, after the forming of the $N^{th}$ trench, the method may further include removing the slit layer; applying a light blocking material layer onto the organic layer to fill the first to $N^{th}$ trenches; and removing a portion of the light blocking material layer disposed on a top surface of the organic layer.

In an embodiment, the first inorganic protective layer and the $(N-1)^{th}$ inorganic protective layer may include mutually different materials from each other.

In an embodiment, each of the first to $(N-1)^{th}$ inorganic protective layers includes a transparent material.

In an embodiment, an amount of a portion of the light blocking material filled in the first trench may be the largest among amounts of portions of the light blocking material filled in the first trench and the second to $N^{th}$ trenches, respectively.

An embodiment of a display device includes an encapsulation layer disposed on a light emitting layer; and a light blocking pattern disposed on the encapsulation layer, the light blocking pattern may include an organic layer defining a trench, and disposed on the encapsulation layer; a light blocking material disposed in the trench of the organic layer; and an inorganic protective layer disposed between at least a portion of a side surface of the organic layer defining the trench and the light blocking material.

In an embodiment, the trench may include a first trench extending from a top surface of the organic layer in a direction from the top surface of the organic layer toward the encapsulation layer; and a second trench extending from the first trench in the direction from the top surface of the organic layer toward the encapsulation layer.

In an embodiment, the inorganic protective layer may include a first inorganic protective layer disposed between the first trench and the light blocking material; and a second inorganic protective layer disposed between the first inorganic protective layer and the light blocking material and between the second trench and the light blocking material.

In an embodiment, a height of the light blocking pattern is greater than, equal to about 10 μm, and less than, or equal to about 40 μm.

As described above, according to embodiments of the disclosure, a method of manufacturing a display device may include: forming an organic layer on an encapsulation layer disposed on a light emitting layer; forming a slit layer on the organic layer, where a slit exposing at least a portion of a top surface of the organic layer is formed in the slit layer; forming a first trench by performing a primary etching on the organic layer by using the slit layer as a mask; forming a first inorganic protective layer covering a side surface of the first trench; forming a second trench extending from the first trench by performing a secondary etching on the organic layer by using the slit layer as a mask; and forming a light blocking material filling the first trench and the second trench. In such embodiments, since a light blocking pattern for controlling a viewing angle is integrated in the display device, a thickness of the display device can be reduced.

In addition, according to embodiments of the disclosure, a method of manufacturing a display device may include: forming an organic layer on an encapsulation layer disposed on a light emitting layer; forming a slit layer on the organic layer, where a slit exposing at least a portion of a top surface of the organic layer is formed in the slit layer; forming a first trench by performing a primary etching on the organic layer by using the slit layer as a mask; forming a first inorganic protective layer covering a side surface of the first trench; forming a second trench extending from the first trench by performing a secondary etching on the organic layer by using the slit layer as a mask; forming an $(N-1)^{th}$ inorganic protective layer covering side surfaces of first to $(N-1)^{th}$ trenches, forming an $N^{th}$ trench extending from the $(N-1)^{th}$ trench by performing an $N^{th}$-degree-etching on the organic layer by using the slit layer as a mask, where forming an additional inorganic protective layer and forming an additional trench are repeatedly performed (N−2) times, respectively; and forming a light blocking material filling the first to $N^{th}$ trenches. In such embodiments, N may be a natural number that is greater than or equal to 3. Accordingly, the display device manufactured by the method of manufacturing the display device can ensure a frontal transmittance together with a viewing angle blocking effect.

According to embodiments of the disclosure, a display device may include: an encapsulation layer disposed on a light emitting layer; and a light blocking pattern disposed on the encapsulation layer, where the light blocking pattern includes: an organic layer defining a trench, and disposed on the encapsulation layer; a light blocking material disposed in the trench of the organic layer; and an inorganic protective layer disposed between at least a portion of a side surface of the organic layer defining the trench and the light blocking material. Accordingly, a weight and a thickness of the display device can be reduced.

However, features of embodiments of the disclosure are not limited to those described above, and may be variously modified or expanded without departing from the spirit or scope of the disclosure.

BRIEF DESCRIPTION OF THE DRAWINGS

Illustrative, non-limiting embodiments will be more clearly understood from the following detailed description in conjunction with the accompanying drawings.

FIG. 4 is a flowchart for describing a process of forming a slit layer 20 included in the manufacturing method of FIG. 3.

FIG. 5 is a flowchart for describing a process of forming a first inorganic protective layer 30 included in the manufacturing method of FIG. 3.

FIGS. 8 to 20 are cross-sectional views for describing the manufacturing method of FIG. 7.

DETAILED DESCRIPTION

Figure 1:
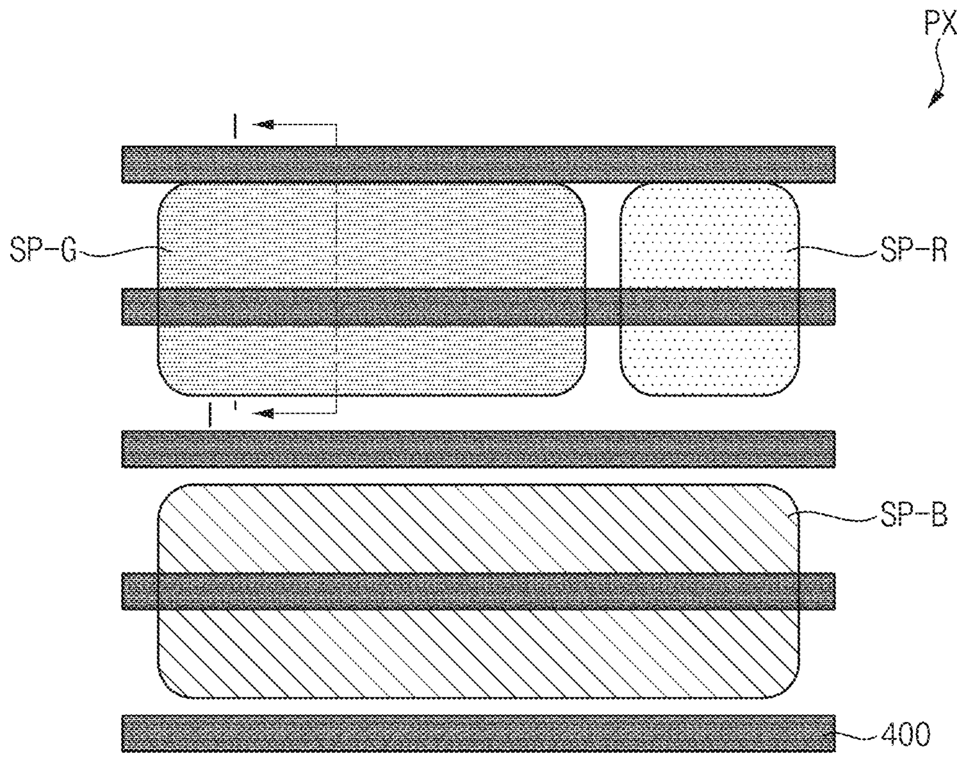
FIG. 1 is a plan view showing an arrangement of subpixels of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
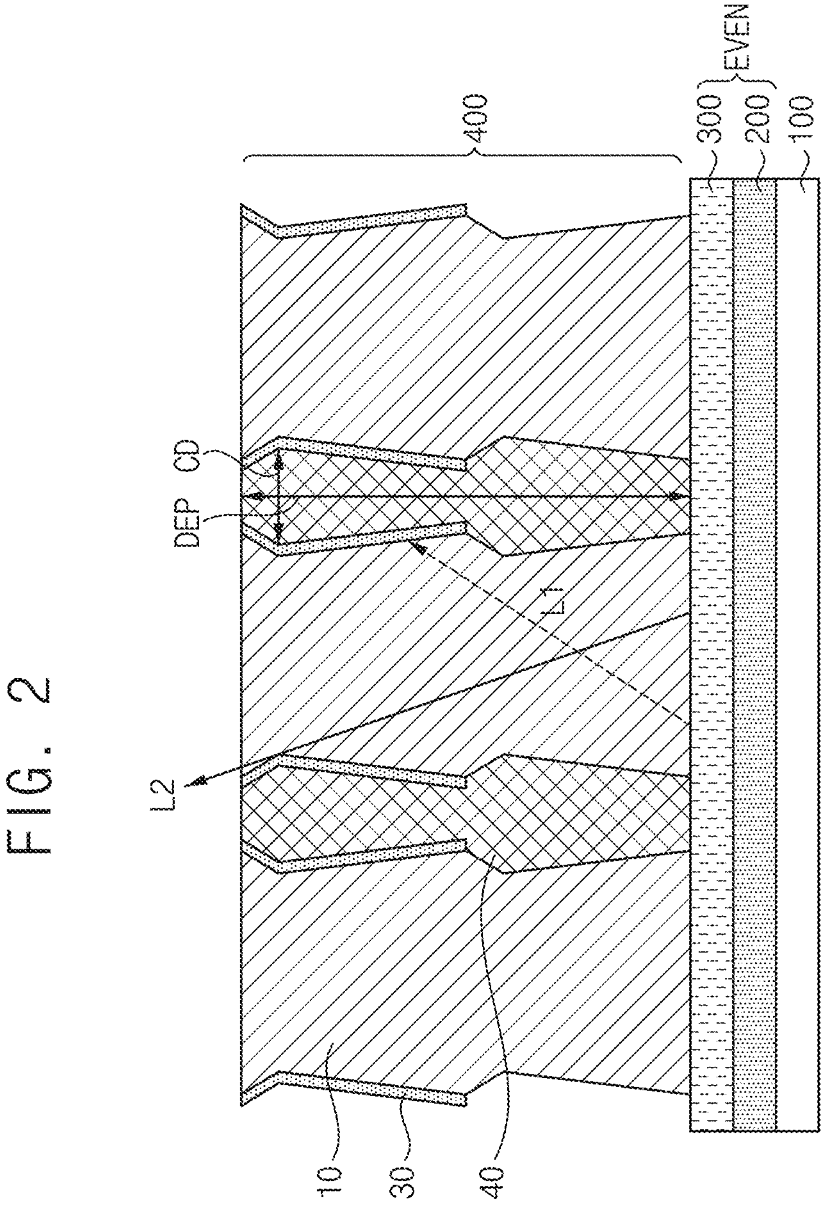
FIG. 2 is a cross-sectional view taken along line I-I' of FIG. 1.

FIG. 1 is a plan view showing an arrangement of subpixels of a display device according to an embodiment of the disclosure, and FIG. 2 is a cross-sectional view taken along line I-I' of FIG. 1.

Referring to FIGS. 1 and 2, according to an embodiment of the disclosure, a display device may include a substrate 100, a light emitting layer 200, an encapsulation layer 300, and a light blocking pattern 400.

The substrate 100 may be an insulating substrate including a transparent or opaque material.

According to an embodiment, the substrate 100 may include glass. In such an embodiment, a display device 2000 may be a rigid display device.

According to an alternative embodiment, the substrate 100 may include plastic. In such an embodiment, the display device 2000 may be a flexible display device.

In an embodiment, for example, the substrate including the plastic may include polyethersulphone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), or the like. These may be used alone or in combination with each other. However, the disclosure is not necessarily limited thereto.

A conductive layer including a buffer layer, a plurality of conductive wires, an insulating layer, and a plurality of thin film transistors may be disposed on the substrate 100. A first pixel electrode may be disposed on the conductive layer. According to an embodiment, the first pixel electrode may be an anode electrode. A pixel defining layer may be disposed on the first pixel electrode. A plurality of openings may be defined through the pixel defining layer to expose at least a portion of the first pixel electrode. However, the disclosure is not necessarily limited thereto.

The light emitting layer 200 may be disposed on the substrate 100. In an embodiment, the light emitting layer 200 may be disposed on the pixel electrode and the pixel defining layer. The light emitting layer 200 may include an organic light emitting material, quantum dots, or the like. These may be used alone or in combination with each other.

According to an embodiment, the light emitting layer 200 may emit a light having one color among a red color, a green color, and a blue color. According to alternative embodiment, the light emitting layer 200 may emit a light having one color among a white color, a cyan color, a magenta color, and a yellow color.

In an embodiment where the light emitting layer 200 includes an organic light emitting material, the organic light emitting material may include a low molecular weight organic compound or a high molecular weight organic compound. The low molecular weight organic compound may include copper phthalocyanine, N, N'-diphenylbenzidine, tris-(8-hydroxyquinoline) aluminum, or the like, and the high molecular weight organic compound may include poly (3,4-ethylenedioxythiophene), polyaniline, poly-phenylenevinylene, polyfluorene, or the like. These may be used alone or in combination with each other.

In an embodiment where the light emitting layer 200 includes quantum dots, the quantum dots may include a core including a group II-VI compound, a group III-V compound, a group IV-VI compound, a group IV element, a group IV compound, or a combination thereof. According to an embodiment, the quantum dot may have a core-shell structure including a core and a shell surrounding the core. The shell may serve as a protective layer for maintaining semiconductor characteristics by preventing chemical deterioration of the core, and serve as a charging layer for imparting electrophoretic characteristics to the quantum dot.

The light emitting layer 200 may be formed as (or defined by) multiple layers, that is, have a multi-layer structure. According to an embodiment, the light emitting layer 200 may have a structure in which blue organic light emitting layers are stacked. According to an alternative embodiment, the light emitting layer 200 may have a structure in which organic light emitting layers configured to emit lights having different colors from each other are stacked. In an embodiment, for example, the light emitting layer 200 may include first to third light emitting layers. The first light emitting layer may emit a red light, the second light emitting layer may emit a green light, and the third light emitting layer may emit a blue light.

A common electrode may be disposed on the light emitting layer 200 and the pixel defining layer. According to an embodiment, the common electrode may be a cathode electrode. Functional layers may be disposed on and/or under the light emitting layer 200. In an embodiment, for example, the functional layers may include a hole injection layer, a hole transport layer, an electron transport layer, an electron injection layer, or the like. However, the disclosure is not necessarily limited thereto.

The light emitting layer 200 may include a plurality of pixels.

In an embodiment, as shown in FIG. 1, each of the pixels may include a plurality of sub-pixels to express various colors. According to an embodiment, one unit pixel PX may include three sub-pixels. In an embodiment, for example, the three sub-pixels may include a first sub-pixel SP-R configured to emit a red light, a second sub-pixel SP-G configured to emit a green light, and a third sub-pixel SP-B configured to emit a blue light.

In an embodiment, as shown in FIG. 1, a number of sub-pixels may be three, but the disclosure is not limited thereto. In an alternative embodiment, for example, one unit pixel PX may further include a fourth sub-pixel configured to emit a white light.

Each of the first to third sub-pixels SP-R, SP-G, and SP-B may include at least one thin film transistor and at least one light emitting element. An image may be generated by combining the lights emitted from the first to third sub-pixels SP-R, SP-G, and SP-B, respectively.

According to an embodiment, the third sub-pixel SP-B may have lower light emission efficiency than the first sub-pixel SP-R and the second sub-pixel SP-G. Therefore, the first sub-pixel SP-R, the second sub-pixel SP-G, and the third sub-pixel SP-B may have different areas from each other. In an embodiment, for example, the area of the third sub-pixel SP-B may be larger than each of the areas of the first sub-pixel SP-R and the second sub-pixel SP-G.

According to an alternative embodiment, the first sub-pixel SP-R, the second sub-pixel SP-G, and the third sub-pixel SP-B may have the same area.

According to an embodiment, one unit pixel PX may include one first sub-pixel SP-R, one second sub-pixel SP-G, and one third sub-pixel SP-B.

According to an alternative embodiment, one unit pixel PX may include two second sub-pixels SP-G having high luminance weights.

Each of the first to third sub-pixels SP-R, SP-G, and SP-B may have various shapes such as a polygonal shape, a circular shape, or an elliptical shape. However, the disclosure is not necessarily limited thereto.

The encapsulation layer 300 may be disposed on the light emitting layer 200.

According to an embodiment, the encapsulation layer 300 may include at least one inorganic encapsulation layer and at least one organic encapsulation layer. In an embodiment, for example, the encapsulation layer 300 may include a first inorganic encapsulation layer disposed on the light emitting layer 200, an organic encapsulation layer disposed on the first inorganic encapsulation layer, and a second inorganic encapsulation layer disposed on the organic encapsulation layer.

The inorganic encapsulation layer may include silicon oxide ($SiO_x$), silicon nitride ($SiN_x$), silicon oxynitride ($SiO_xN_y$), or the like. These may be used alone or in combination with each other.

The organic encapsulation layer may include an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, a perylene-based resin, or the like. These may be used alone or in combination with each other.

According to an alternative embodiment, the encapsulation layer 300 may include only inorganic encapsulation layers. In an embodiment, for example, the encapsulation layer 300 may include a first inorganic encapsulation layer disposed on the light emitting layer 200, a plasma treatment layer obtained by performing a plasma treatment on the first inorganic encapsulation layer, and a second inorganic encapsulation layer disposed on the plasma treatment layer.

The encapsulation layer 300 may protect the light emitting layer 200 disposed on the substrate 100. The light emitting layer 200 may be formed through an evaporation process, and the encapsulation layer 300 may be formed through an encapsulation process. The light emitting layer 200 and the encapsulation layer 300 are collectively referred to as an even layer EVEN.

A touch layer may be further disposed on the encapsulation layer 300. The touch layer may include a first touch electrode, a first touch insulating layer, a second touch electrode, and a second touch insulating layer.

The first touch electrode may include a metal, an alloy, conductive metal oxide, a transparent conductive material, or the like. These may be used alone or in combination with each other.

The first touch insulating layer may cover the first touch electrode. The first touch insulating layer may include an inorganic insulating material. For example, the first touch insulating layer may include silicon oxide, silicon nitride, silicon oxynitride, or the like. These may be used alone or in combination with each other.

The second touch electrode may be disposed on the first touch insulating layer to overlap the first touch electrode. The second touch electrode may include a metal, an alloy, conductive metal oxide, a transparent conductive material, or the like. These may be used alone or in combination with each other.

According to an embodiment, the first touch electrode and the second touch electrode may have a mesh structure when viewed in a plan view. However, the disclosure is not necessarily limited thereto, and each of the first touch electrode and the second touch electrode may have various shapes.

The second touch insulating layer may cover the second touch electrode. The second touch insulating layer may include an organic insulating material. For example, the second touch insulating layer may include a photoresist, a polyacryl-based resin, a polyimide-based resin, a polyamide-based resin, a siloxane-based resin, an acryl-based resin, an epoxy-based resin, or the like. These may be used alone or in combination with each other.

The light blocking pattern 400 may be disposed on the even layer EVEN.

According to an embodiment, the light blocking pattern 400 may make direct contact with the encapsulation layer 300. In such an embodiment, the light blocking pattern 400 may be disposed on the encapsulation layer 300, and the touch layer may be disposed on the light blocking pattern 400.

According to an alternative embodiment, the light blocking pattern 400 may be disposed on the touch layer disposed on the encapsulation layer 300. In such an embodiment, the touch layer may be disposed on the encapsulation layer 300, and the light blocking pattern 400 may be disposed on the touch layer.

According to an alternative embodiment, where the light emitting layer 200 has a bottom light emission structure, the light blocking pattern 400 may be arranged parallel to a traveling direction of a light emitted from the light emitting layer 200. In such an embodiment, the light blocking pattern 400 may be disposed on the substrate 100, and the even layer EVEN may be disposed on the light blocking pattern 400.

The light blocking pattern 400 may be variously arranged on one unit pixel PX.

According to an embodiment, as shown in FIG. 1, the light blocking pattern 400 may be disposed on the first to third sub-pixels SP-R, SP-G, and SP-B in one direction. FIG. 2 is an enlarged cross-sectional view showing the light blocking pattern 400 disposed on the second sub-pixel SP-G of FIG. 1.

According to an alternative embodiment, the light blocking pattern 400 may be disposed in a lattice shape on one unit pixel PX.

According to another alternative embodiment, the light blocking pattern 400 may overlap only some of the first to third sub-pixels SP-R, SP-G, and SP-B. In an embodiment, for example, when one unit pixel PX includes two second sub-pixels SP-G, the light blocking pattern 400 may overlap only one second sub-pixel SP-G.

According to another alternative embodiment, the light blocking pattern 400 may be disposed on only some pixels. In an embodiment, for example, one unit pixel PX on which the light blocking pattern 400 is disposed and one unit pixel PX on which the light blocking pattern 400 is not disposed may be alternately arranged.

However, the disclosure is not necessarily limited thereto.

In an embodiment, the light blocking pattern 400 may include an organic layer 10 and a light blocking material 40. In an embodiment, the light blocking pattern 400 may further include a first inorganic protective layer 30 between the organic layer 10 and the light blocking material 40. The light blocking material 40 may fill (or be disposed in) a space formed by etching the organic layer 10. In such an embodiment, the organic layer 10 may serve as a mold for the light blocking material 40. Accordingly, the organic layer 10 may surround the light blocking pattern 400 when viewed in a plan view.

The structure of the light blocking pattern 400 will be described in detail below with reference to FIGS. 7 to 21.

The light emitted from the light emitting layer 200 may be blocked by the light blocking pattern 400. While a first exiting light L1 exiting at an angle that is greater than or equal to a predetermined angle may be blocked by the light blocking pattern 400, a second exiting light L2 exiting at an angle that is less than the predetermined angle may be transmitted. The predetermined angle may be defined as a cut-off angle.

When an exiting angle exceeds the cut-off angle, a light emitted from the light emitting layer 200 (e.g., the first exiting light L1) may be absorbed by the light blocking material 40.

In an embodiment, when the exiting angle is greater than or equal to 0 degrees and less than or equal to the cut-off angle, a light emitted from the light emitting layer 200 (e.g., the second exiting light L2) may be transmitted. In such an embodiment, the light blocking material 40 may not absorb the second exiting light L2.

Hereinafter, an etching scheme capable of increasing an etching depth (e.g., an etching depth DEP of FIG. 2) and decreasing a critical value (e.g., a critical value CD of FIG. 2) will be described in detail with reference to FIGS. 3 to 20.

Figure 3:
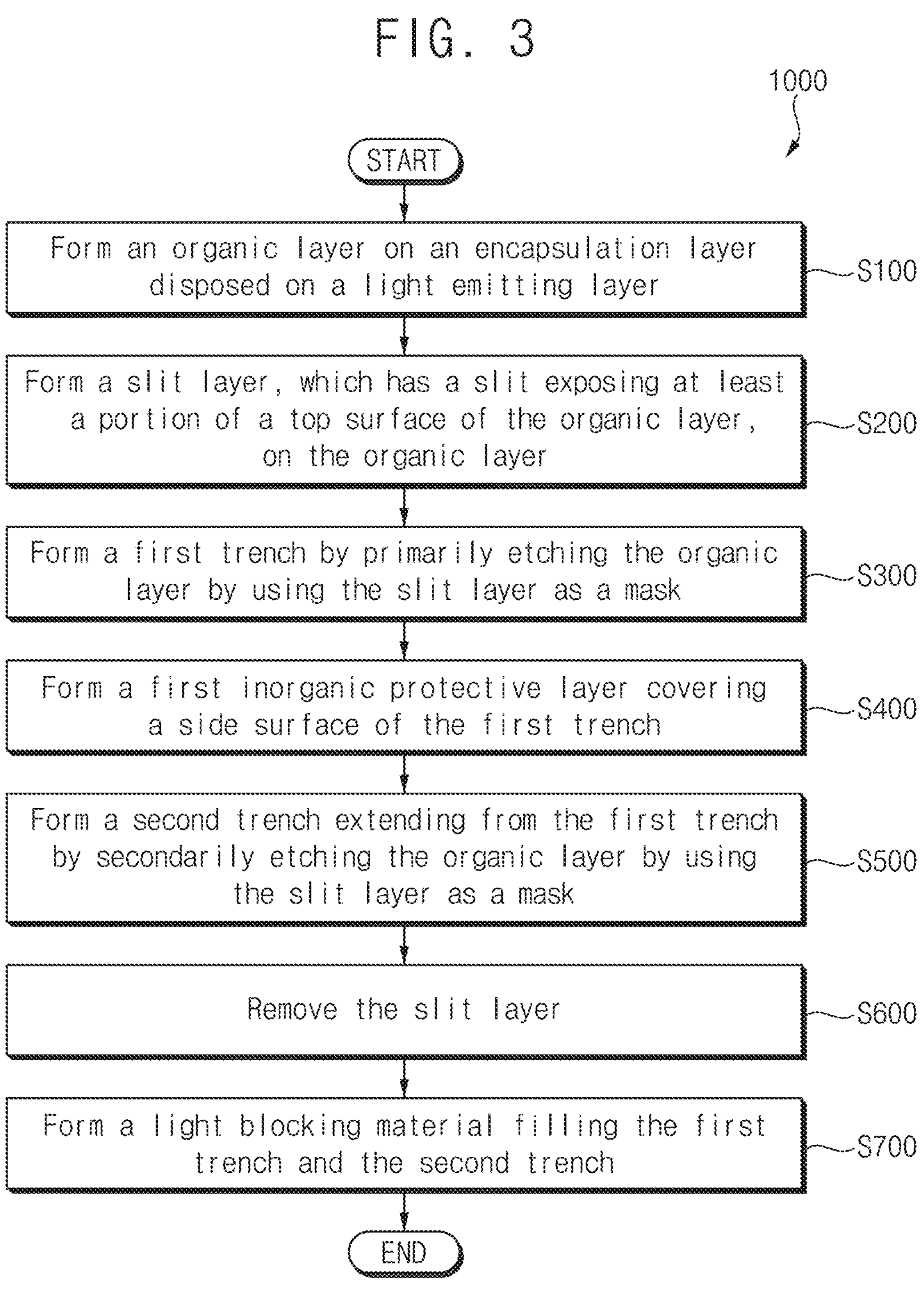
FIG. 3 is a flowchart for describing a method of manufacturing a display device according to an embodiment of the disclosure.
Figure 6:
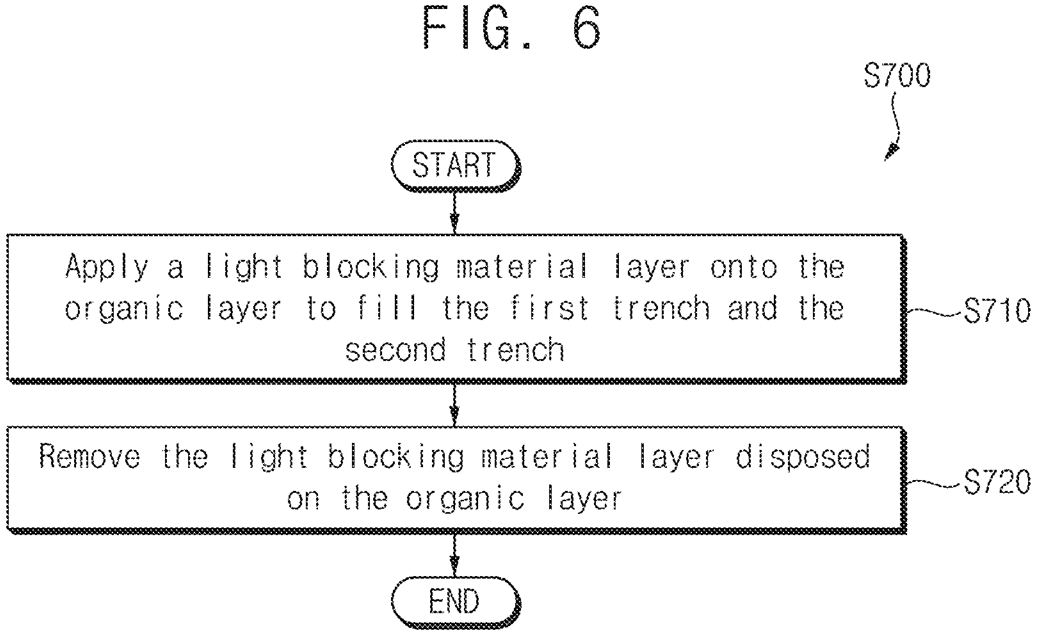
FIG. 6 is a flowchart for describing a process of removing the slit layer 20 included in the manufacturing method of FIG. 3.

FIG. 3 is a flowchart for describing a method of manufacturing a display device according to an embodiment of the disclosure. FIG. 4 is a flowchart for describing a process of forming a slit layer 20 included in the manufacturing method of FIG. 3. FIG. 5 is a flowchart for describing a process of forming a first inorganic protective layer 30 included in the manufacturing method of FIG. 3. FIG. 6 is a flowchart for describing a process of removing the slit layer 20 included in the manufacturing method of FIG. 3. FIGS. 8 to 20 are cross-sectional views for describing the manufacturing method of FIG. 7. For convenience of description, an embodiment of a method of manufacturing a display device will be described with further reference to FIGS. 8 to 14 and FIGS. 18 to 20.

Referring to FIG. 3, an organic layer 10 may be formed (or provided) on an encapsulation layer 300 disposed on a light emitting layer 200 (S100), a slit layer 20 with a slit S (shown in FIG. 10) exposing at least a portion of a top surface of the organic layer 10 may be formed on the organic layer 10 (S200), a first trench P1 may be formed by primarily etching (by performing a primary etching on) the organic layer 10 by using the slit layer 20 as a mask (S300), a first inorganic protective layer 30 covering a side surface HB1 of the first trench P1 may be formed (S400), a second trench P2 extending from the first trench P1 may be formed by secondarily etching (by performing a secondary etching on) the organic layer by using the slit layer 20 as a mask (S500), the slit layer 20 may be removed (S600), and a light blocking material 40 filling the first trench P1 and the second trench P2 may be formed (S700).

Referring to FIGS. 3 and 8, the organic layer 10 may be provided or formed on the encapsulation layer 300 disposed on the light emitting layer 200 (S100). In an embodiment, the organic layer 10 may be formed on the even layer EVEN.

The organic layer 10 may include an organic insulating material or the like. According to an embodiment, the organic layer 10 may include a photoresist, a polyacryl-based resin, a polyimide-based resin, a polyamide-based resin, a siloxane-based resin, an acryl-based resin, an epoxy-based resin, or the like. These may be used individually or in combination with each other.

The organic layer 10 may be formed in various schemes or manners. In an embodiment, for example, after an adhesive layer is arranged on the substrate 100, coating and curing of the organic insulating material may be performed to form the organic layer 10. In an alternative embodiment, for example, the organic insulating material may be imprinted by using a mold to form the organic layer 10. The organic layer 10 may be formed by curing the organic insulating material through the imprinting process.

A light refractive index of the organic layer 10 may be different from a light refractive index of the substrate 100. Accordingly, a viewing angle of the display device 2000 may be ensured more easily. However, the disclosure is not limited thereto.

A thickness D101 (shown in FIG. 8) of the organic layer 10 may be variously determined based on a frontal transmittance and a cut-off angle which are predetermined (e.g., a desired frontal transmittance and a desired cut-off angle). According to an embodiment, the thickness D101 of the organic layer 10 may be less than or equal to about 50 micrometers (μm). In an embodiment, for example, the thickness D101 of the organic layer may be greater than or equal to about 10 μm, and less than or equal to about 40 μm, that is in a range of about 10 μm to about 40 μm.

A thickness of a light control film (LCF) that is commercially available may be about 100 μm. Accordingly in a case where the commercially available LCF is attached to the display device, the display device may become thicker.

In an embodiment of the method of manufacturing the display device according to the disclosure, the light blocking pattern 400 may be integrated inside the display device. The thickness D101 of the organic layer 10 included in the light blocking pattern 400 may be less than or equal to about 50 μm. Accordingly, a thickness of the display device may become smaller compared with a case where the commercially available LCF is attached to the display device.

Referring to FIGS. 3, 4, 9, and 10, the slit layer 20 may be formed on the organic layer 10 (S200). The slit layer 20 may be provided with the slit S exposing at least the portion of the top surface of the organic layer 10.

Figure 9:
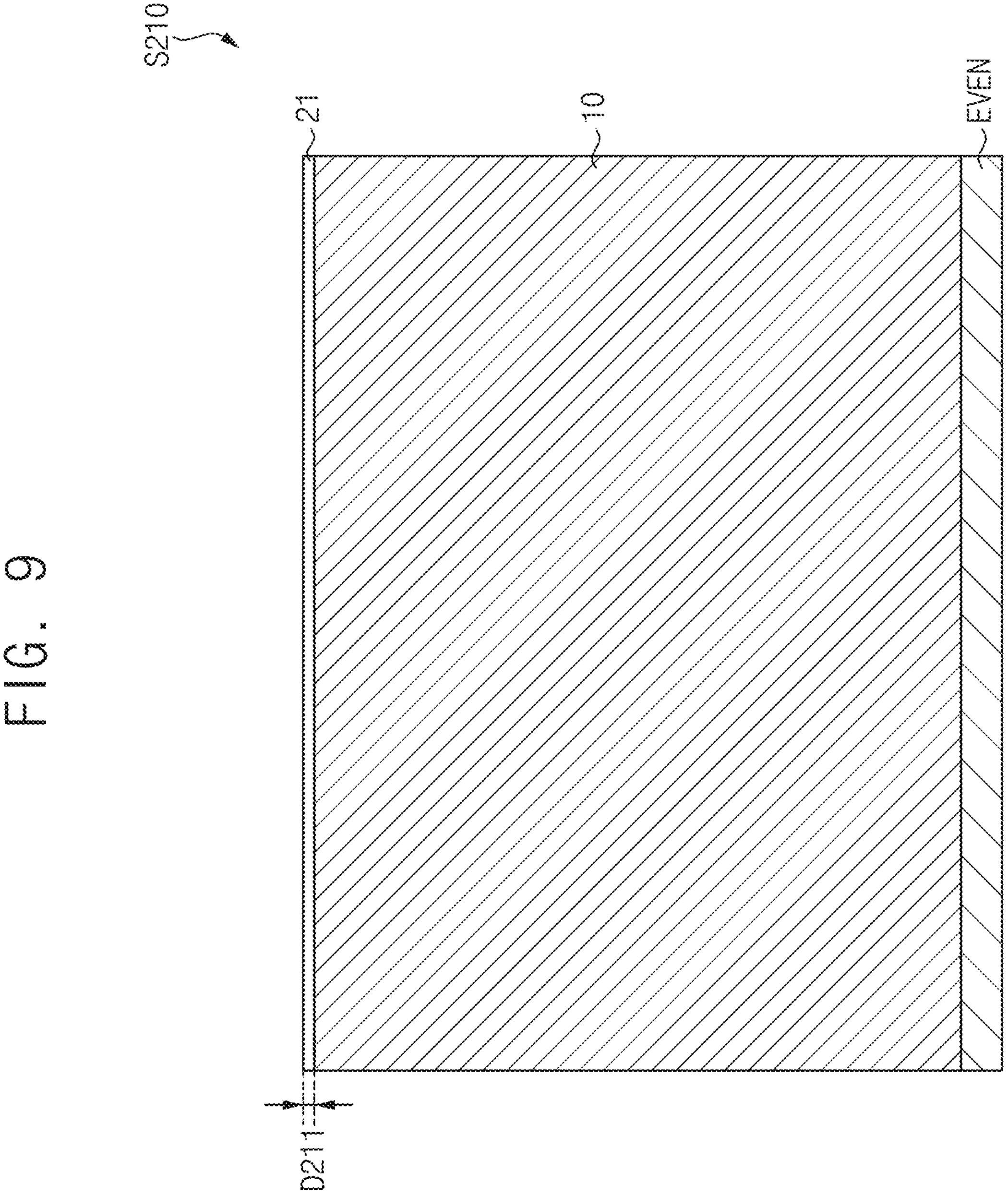

As shown in FIG. 9, a metal layer 21 may be formed on the organic layer 10 (S210).

The metal layer 21 may function as a mask during an etching process of the organic layer 10 that will be described below. According to an embodiment, the metal layer 21 may include aluminum (Al), molybdenum (Mo), an aluminum-containing alloy, a molybdenum-containing alloy, or the like. These may be used alone or in combination with each other.

The slit layer 20 may include a material that may be dry-etched or wet-etched. The slit layer 20 may be removed through a wet etching process. Therefore, the metal layer 21 may include a material that may be wet-etched. In addition, when the slit layer 20 is formed, a portion of the metal layer 21 may be removed through a dry etching process to form slits S at a minute interval. Therefore, the metal layer 21 may include a material that may be dry-etched. In an embodiment, the metal layer 21 may include aluminum (Al).

In an embodiment where a critical value (e.g., the critical value CD of FIG. 2) is large, the metal layer 21 may be formed of a material that may be wet-etched only. However, the disclosure is not necessarily limited thereto.

A thickness D211 (shown in FIG. 9) of the metal layer 21 may be greater than or equal to a predetermined thickness that allows the metal layer 21 to remain after a multistage etching process.

Figure 10:
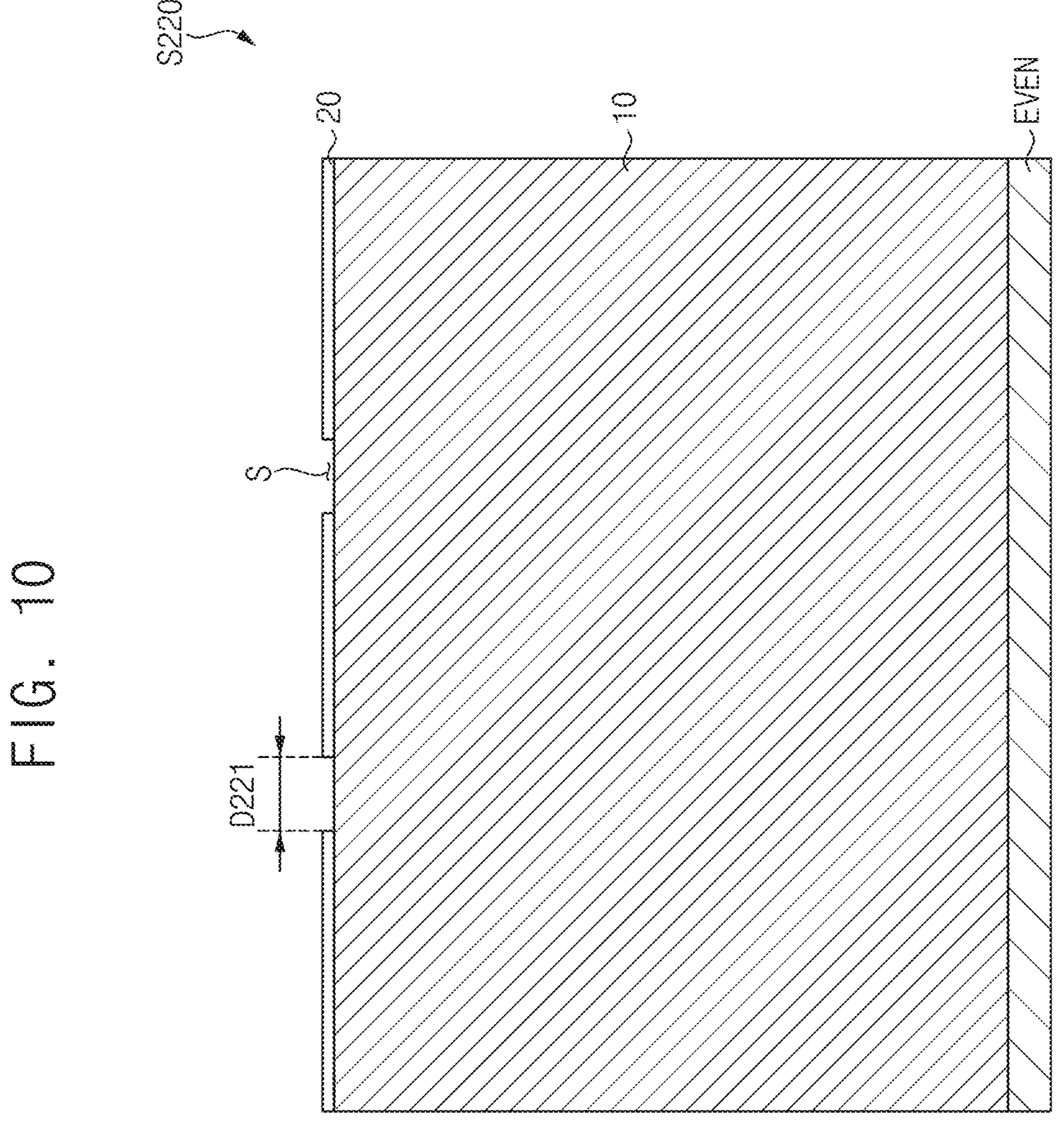

As shown in FIG. 10, the slit S exposing at least the portion of the top surface of the organic layer 10 may be formed through the slit layer 20 (S220).

The slit layer 20 may be formed in various schemes or manners. In an embodiment, for example, after the metal layer 21 is deposited, the slit layer 20 may be formed through a photolithography process. As described above, when the slit S is formed, both the dry etching process and the wet etching process may be used.

According to an embodiment, the slit layer 20 may be formed through the dry etching process. A photoresist applied onto the metal layer 21 may be removed through the dry etching process. Accordingly, the slit layer 20 with the slits S formed at a minute interval may be formed.

According to an alternative embodiment, the slit layer 20 may be formed through the wet etching process. In an embodiment, where the critical value is large, the slit layer 20 may be formed through the wet etching process.

A width D221 of the slit S may be variously determined or modified.

According to an embodiment, the width D221 of the slit S may match a pixel interval. The width D221 of the slit S may determine a width of the light blocking material 40. In such an embodiment, a distance between the light blocking material 40 and an adjacent light blocking material 40 may match a distance between a pixel and a pixel adjacent to the pixel, so that a moiré phenomenon may be alleviated in the display device. However, the disclosure is not limited thereto.

Figure 11:
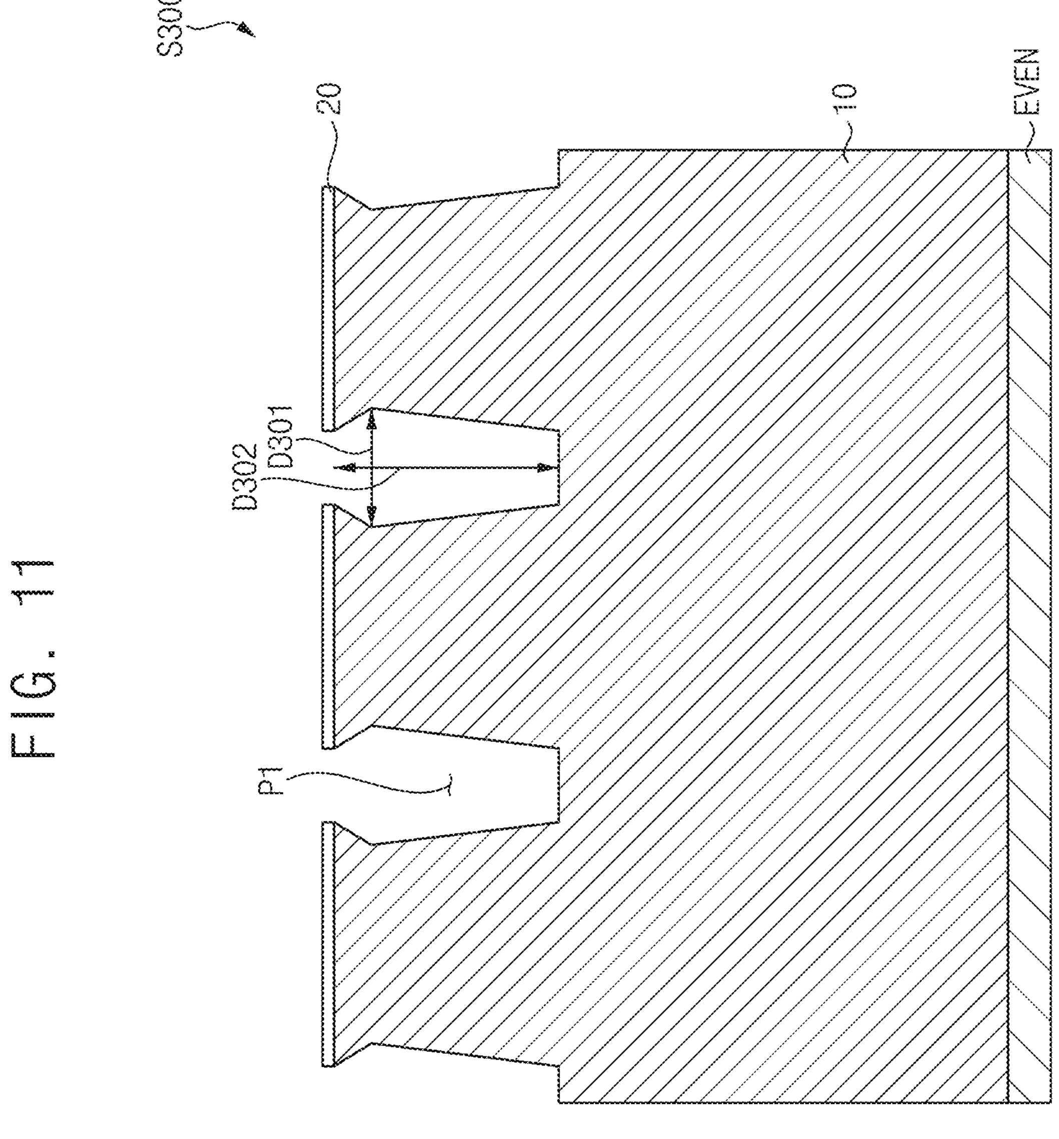

Referring to FIGS. 3 and 11, the first trench P1 may be formed by primarily etching the organic layer 10 by using the slit layer 20 as the mask (S300).

The first trench P1 may be formed through an etching process.

According to an embodiment, the primary etching process may be the dry etching process. In the wet etching process, a critical value D301 (or the critical value CD in FIG. 2) may be increased. As the critical value D301 increases, an amount of the light blocking material 40 may be increased, so that it may be difficult to ensure the frontal transmittance. In the dry etching process, etching may be performed by accelerating charged particles in only one direction. Accordingly, an etching section may be finely controlled as compared with the wet etching process. However, the disclosure is not limited thereto.

The critical value D301 of the first trench P1 may be proportional to an etching time.

In an embodiment, the etching time may be set to be long to form the light blocking pattern 400 with a high height. As the etching time increases, the critical value D301 of the first trench P1 may be increased. In such an embodiment, as the etching time increases, an etching depth D302 of the first trench P1 and the critical value D301 of the first trench P1 may be increased. When the critical value D301 is increased, coating of the light blocking material 40 may be performed with a thick thickness. Since the light blocking material 40 blocks more exiting lights as the light blocking material 40 becomes thicker, it may be difficult to ensure the frontal transmittance.

The etching depth D302 of the first trench P1 may be proportional to the etching time.

In an embodiment, the etching time may be set to be short to form the light blocking pattern 400 in a small size. As the etching time decreases, the etching depth D302 of the first trench P1 may be decreased. The cut-off angle may be adjusted according to the etching depth (DEP of FIG. 2) of the light blocking pattern 400.

In an embodiment, for example, where a primary etching time is about 600 seconds, and a width D221 of the slit layer 20 is about 1.27 μm, the critical value D301 may be about 2.5 μm, and the etching depth D302 may be about 16 μm. In such an embodiment, the light blocking material 40 may have a width of about 2.5 μm and a depth of about 16 μm. As the etching time decreases, the critical value D301 may be decreased, and the etching depth D302 may be increased. As the critical value D301 decreases, the frontal transmittance may be further ensured.

Referring to FIGS. 3, 5, 12, and 13, the first inorganic protective layer 30 covering the side surface HB1 of the first trench P1 may be formed (S400). A preliminary first inorganic protective layer may be formed to cover a top surface HA of the slit layer 20, the side surface HB1 of the first trench P1, and a bottom surface HC1 of the first trench P1

(S410). When the preliminary first inorganic protective layer is anisotropically dry-etched, a portion of the preliminary first inorganic protective layer may be removed. The removed portion of the preliminary first inorganic protective layer may be a portion covering the top surface HA of the slit layer 20 and the bottom surface HC1 of the first trench P1. Accordingly, the first inorganic protective layer 30 may be formed (S420).

Figure 12:
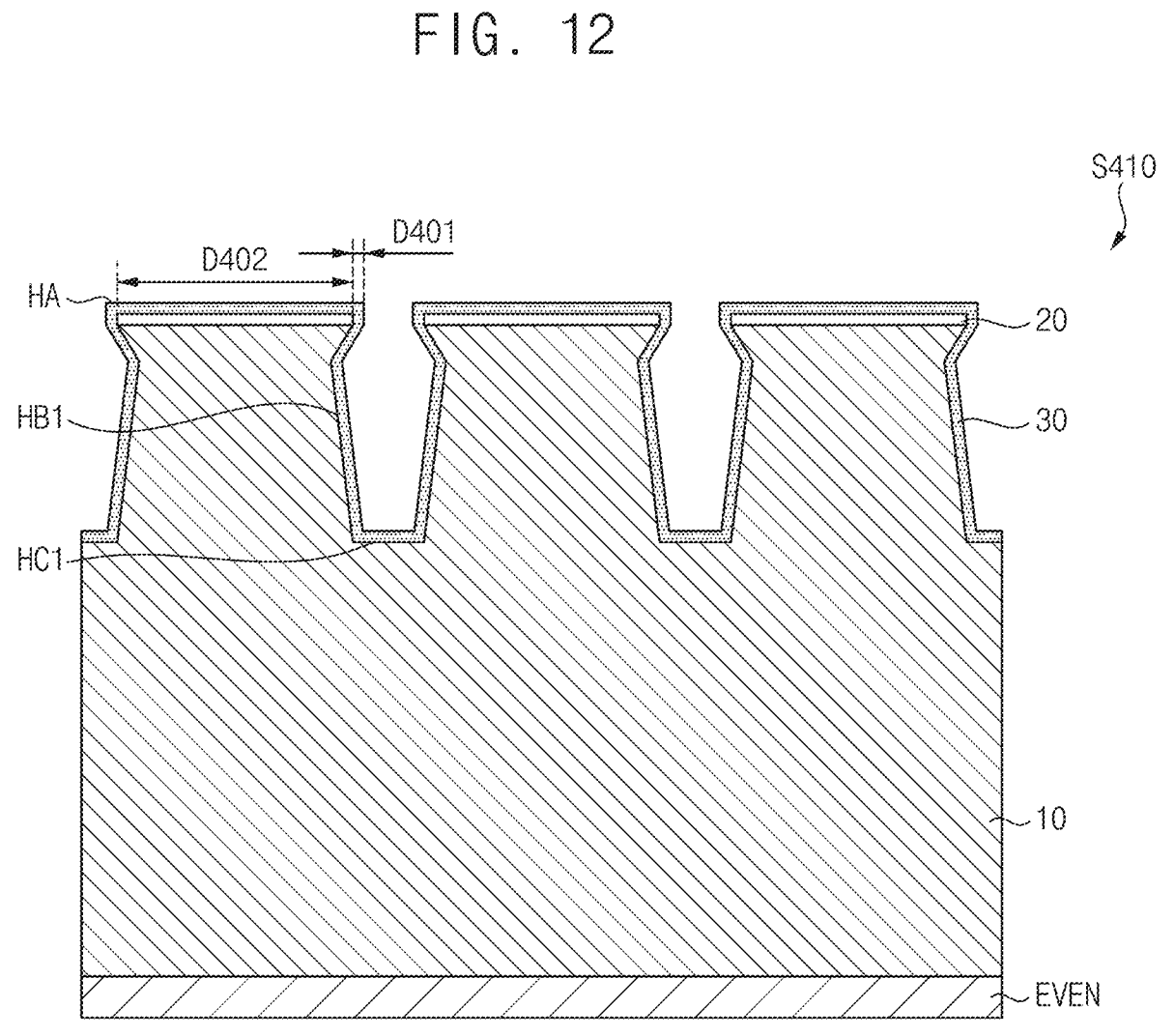

As shown in FIG. 12, the preliminary first inorganic protective layer may be formed to cover all of the top surface HA of the slit layer 20, the side surface HB1 of the first trench P1, and the bottom surface HC1 of the first trench P1 (S410).

The first inorganic protective layer 30 may have a first etching rate for a dry etching process of the organic layer 10 that will be described below. In an embodiment, the organic layer 10 may have a second etching rate that is greater than the first etching rate. In such an embodiment, the first inorganic protective layer 30 may not be affected in the etching process of the organic layer 10. Accordingly, the side surface HB1 of the first trench P1 covered by the first inorganic protective layer 30 may not be etched.

The first inorganic protective layer 30 may include at least one selected from various inorganic materials that may be used as a protective layer in the dry etching process of the organic layer 10 that will be described below. In an embodiment, for example, the first inorganic protective layer 30 may include a silicon insulating material or the like.

According to an embodiment, the preliminary first inorganic protective layer may include silicon nitride ($SiN_x$). In such an embodiment, the light blocking pattern 400 may be formed after the even layer EVEN is formed. Therefore, the preliminary first inorganic protective layer may include the silicon nitride ($SiN_x$) that may be deposited at a low temperature.

According to an alternative embodiment, where the preliminary first inorganic protective layer may be formed at a relatively high temperature, the preliminary first inorganic protective layer may include silicon oxide ($SiO_x$), silicon oxynitride ($SiO_xN_y$), or the like. These may be used alone or in combination with each other. However, the disclosure is not limited thereto.

The first inorganic protective layer 30 may be formed in a chemical vapor deposition (CVD) scheme. However, the disclosure is not limited thereto.

The first inorganic protective layer 30 may include a transparent material. Accordingly, as a thickness D401 of the first inorganic protective layer 30 increases, the frontal transmittance may be improved. The frontal transmittance may be improved as a width D402 of a portion of the upper surface of the organic layer 10 between two adjacent light blocking materials 40 and the thickness D401 of the first inorganic protective layer 30 become thicker.

The thickness D401 of the first inorganic protective layer 30 may be variously determined based on a layer selectivity with respect to the organic layer 10.

According to an embodiment, the layer selectivity of the first inorganic protective layer 30 with respect to the organic layer 10 may be high. In such an embodiment where the layer selectivity is high, the first inorganic protective layer 30 may be hardly etched in a secondary etching process that will be described below. Therefore, when the layer selectivity of the first inorganic protective layer 30 with respect to the organic layer 10 is high, the first inorganic protective layer 30 may be deposited with a thin thickness.

According to an alternative embodiment, the layer selectivity of the first inorganic protective layer 30 with respect to the organic layer 10 may be low. In such an embodiment where the layer selectivity is low, the first inorganic protective layer 30 may be etched in the secondary etching process that will be described below. Therefore, the first inorganic protective layer 30 may be deposited with a thick thickness to protect the organic layer 10 during the secondary etching process. In this case, a deposition thickness D401 of the first inorganic protective layer 30 may be greater than or equal to a predetermined thickness that allows the first inorganic protective layer 30 to remain after being subject to the secondary etching process. The deposition thickness D401 of the first inorganic protective layer 30 may be variously determined based on a secondary etching process time. However, the disclosure is not limited thereto.

Figure 13:
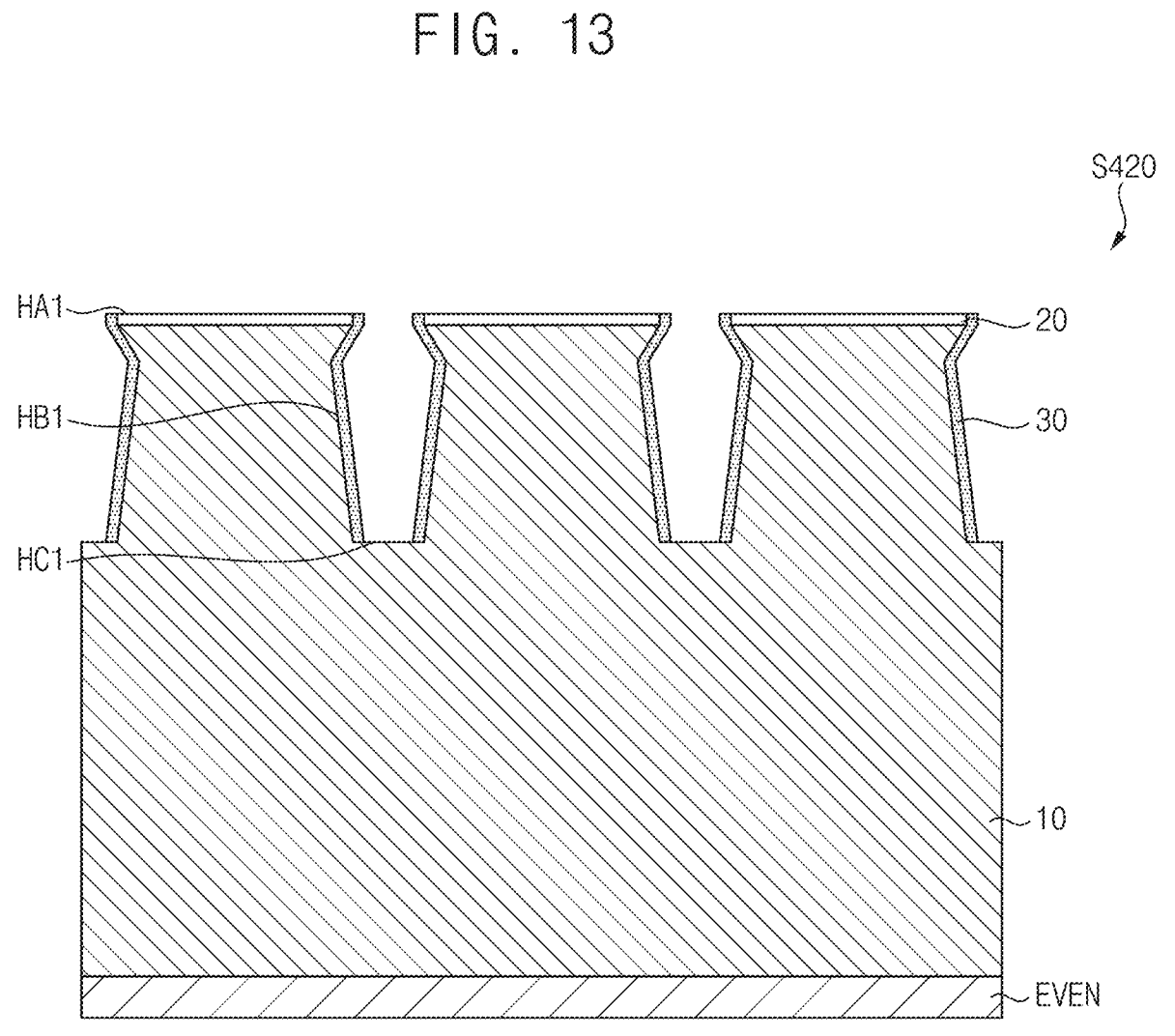

As shown in FIG. 13, only the portion of the preliminary first inorganic protective layer may be removed by anisotropically dry-etching the preliminary first inorganic protective layer (S420). The removed portion of the preliminary first inorganic protective layer may be the portion covering the top surface HA of the slit layer 20 and the bottom surface HC1 of the first trench P1. Accordingly, the first inorganic protective layer 30 covering the side surface HB1 of the first trench P1 may be formed.

The first inorganic protective layer 30 covering the side surface HB1 of the first trench P1 may be formed by etching the preliminary first inorganic protective layer.

According to an embodiment, a scheme of etching the preliminary first inorganic protective layer may be an anisotropic etching process. The anisotropic etching process may be a process in which particles (ions) accelerated into a gaseous state form a highly volatile reaction product on a surface of the preliminary first inorganic protective layer, and a portion of the preliminary first inorganic protective layer is removed as the reaction product is volatilized. Therefore, in the anisotropic etching process, the preliminary first inorganic protective layer may be etched only in a traveling direction of the accelerated particles. An etching target portion may be selected by adjusting an incident direction of the accelerated particles. In an embodiment, for example, only the top surface HA of the slit layer 20 and the bottom surface HC1 of the first trench P1 may be etched by allowing the accelerated particles to be vertically incident onto the organic layer 10.

Figure 14:
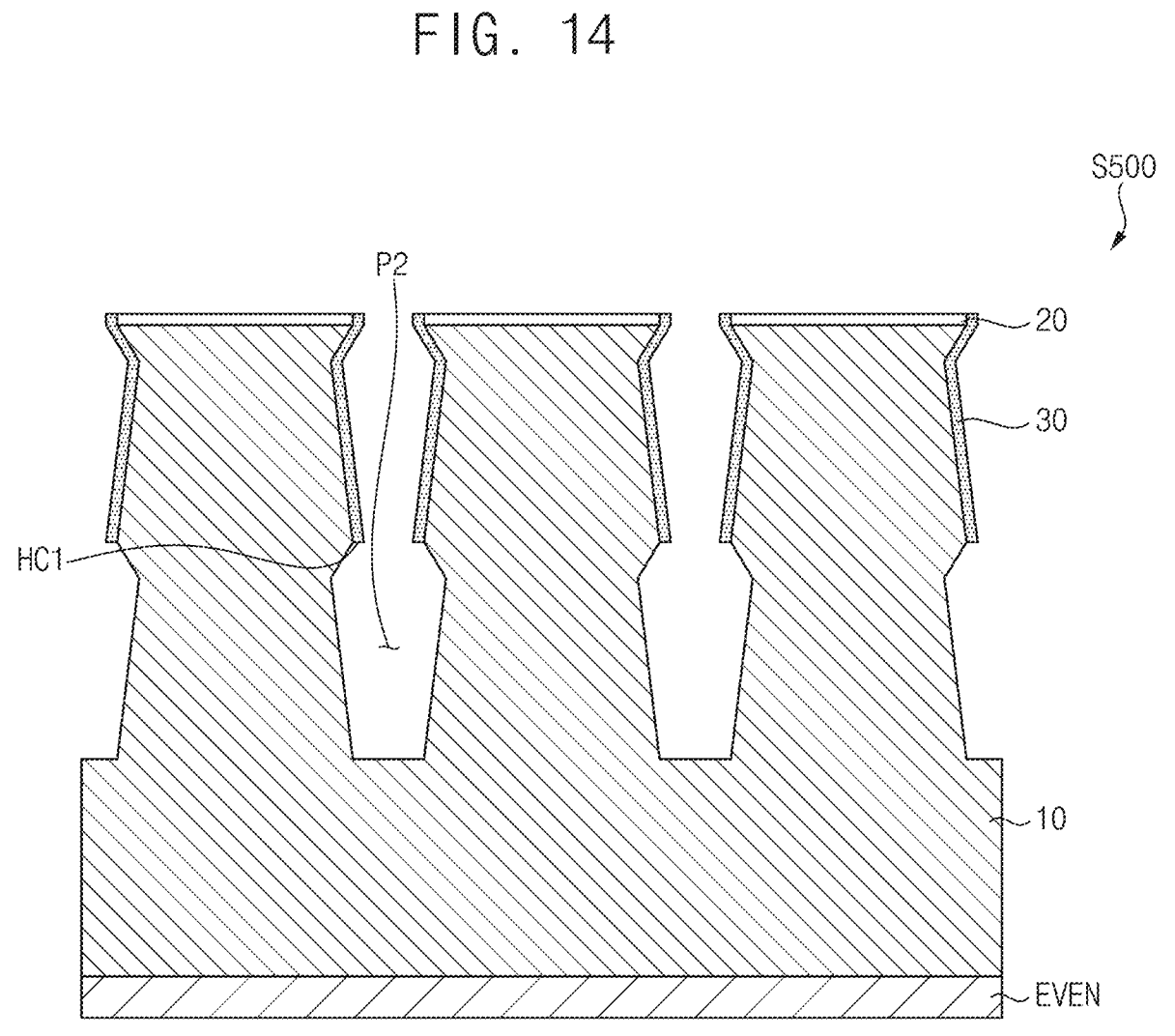

Referring to FIGS. 3 and 14, the second trench P2 extending from the first trench P1 may be formed by secondarily etching the organic layer 10 by using the slit layer 20 as the mask (S500).

The organic layer 10 may be secondarily etched by using the slit layer 20 as the mask. In an embodiment, similarly to the primary etching process, the secondary etching process may be the dry etching process.

In an embodiment, as described above, the first inorganic protective layer 30 may be used as a protective layer during the secondary etching process. In such an embodiment, the first inorganic protective layer 30 may prevent the critical value CD of the first trench P1 (e.g., the critical value D301 of FIG. 11) from being increased during the secondary etching process.

The etching depth may be adjusted by adjusting the etching time. In an embodiment, the secondary etching process time may be adjusted to etch the organic layer 10 in a way such that the first trench P1 may have a first height (or depth), and the second trench P2 may have a second height that is equal to the first height.

However, the disclosure is not limited thereto. In an embodiment, for example, the second height may be different from the first height. According to an embodiment, each of the first height and the second height may be greater than or equal to about 1 μm and less than or equal to about 25 μm. In an embodiment, for example, when the etching time is about 900 seconds, each of the first height and the second height may be about 25 μm. In an alternative embodiment, for example, when the etching time is about 600 seconds, each of the first height and the second height may be about 16 μm. However, the disclosure is not limited thereto.

In an embodiment, a critical value of an uppermost trench and a critical value of a lowermost trench are factors for a viewing angle blocking effect. In such an embodiment, an etching time for forming the first trench P1 and an etching time for forming the second trench P2 may be different from each other to improve the viewing angle blocking effect. Accordingly, a height of the first trench P1 and a height of the second trench P2 may be different from each other. In an embodiment, the height of the first trench P1 may be greater than the height of the second trench P2. Accordingly, the viewing angle blocking effect may be improved. Various viewing angles may be ensured by adjusting the first height and the second height. However, the disclosure is not limited thereto.

Figure 18:
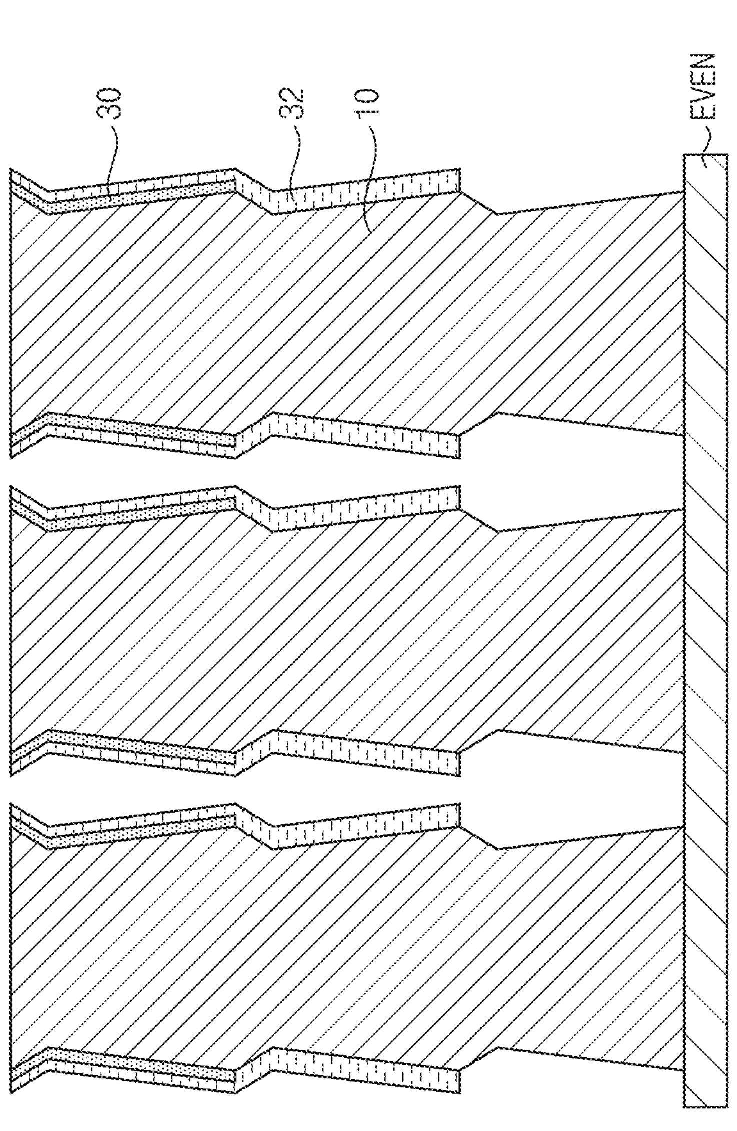

Referring to FIGS. 3 and 18, the slit layer 20 may be removed (S600).

After the organic layer 10 is etched, the slit layer 20 may be removed. According to an embodiment, the slit layer 20 may be removed by using the wet etching. However, the disclosure is not limited thereto.

Referring to FIGS. 3, 6, 19, and 20, the light blocking material 40 filling the first trench P1 and the second trench P2 may be formed (S700). First, the light blocking material may be applied onto the organic layer 10 to fill the first trench P1 and the second trench P2 (S710), and a light blocking material (40) layer disposed on the organic layer 10 may be removed.

Figure 19:
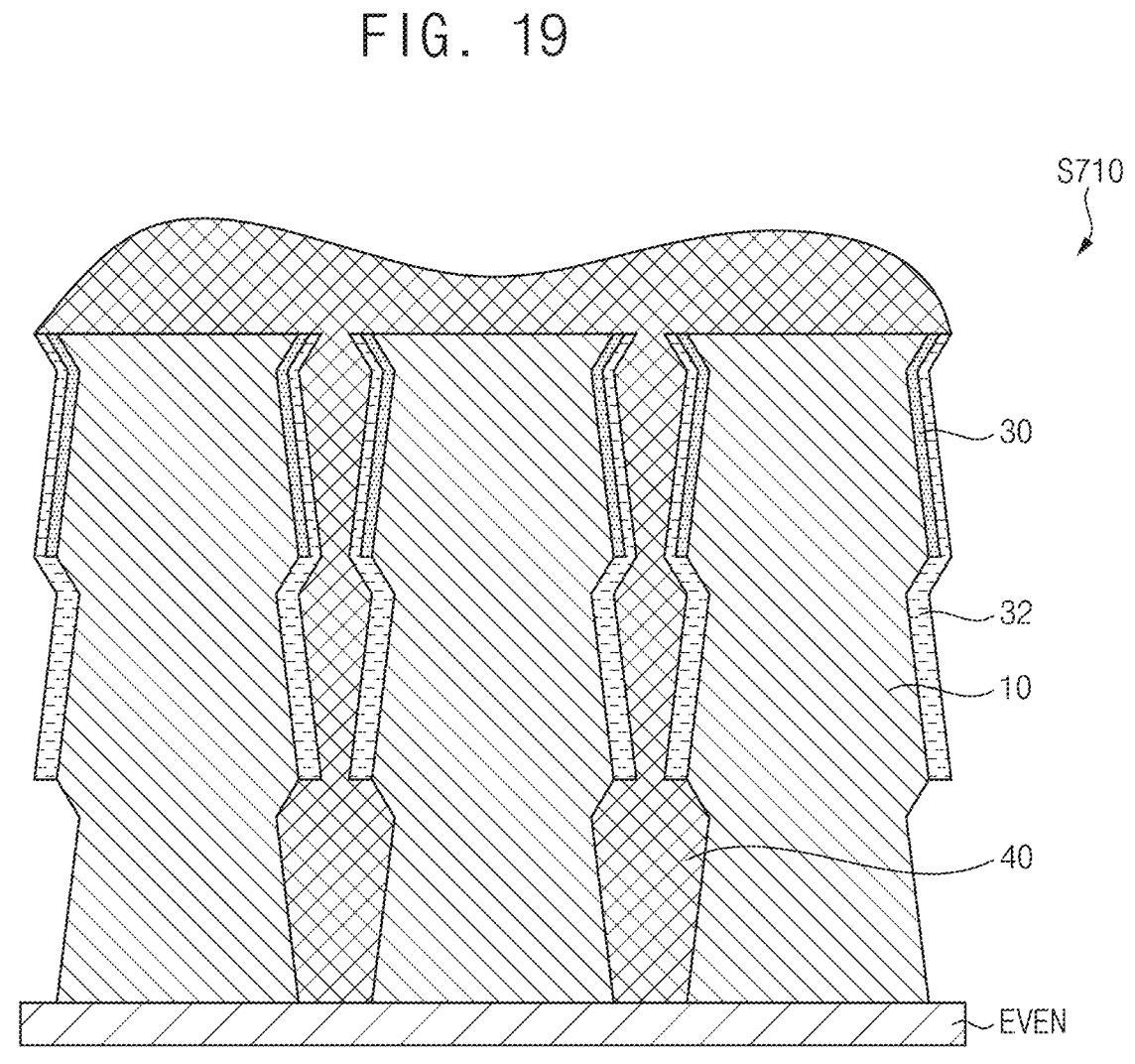

As shown in FIG. 19, the light blocking material 40 may be applied to fill the first trench P1 and the second trench P2 (S710).

The light blocking material 40 may include a material that absorbs or blocks a light emitted from the light emitting layer 200. The light blocking material 40 may include a dark-color pigment such as a black pigment, a dark-color dye, a metal such as aluminum or silver, metal oxide, a dark-color polymer, or the like. These may be used alone or in combination with each other.

According to an embodiment, a light blocking material 40 filled in the first trench P1 and a light blocking material 40 filled in the second trench P2 may be different from each other. The display device may include mutually different light blocking materials 40, so that moiré phenomenon may be further alleviated.

According to an alternative embodiment, the light blocking material 40 filled in the first trench P1 and the light blocking material 40 filled in the second trench P2 may be the same as each other.

Figure 20:
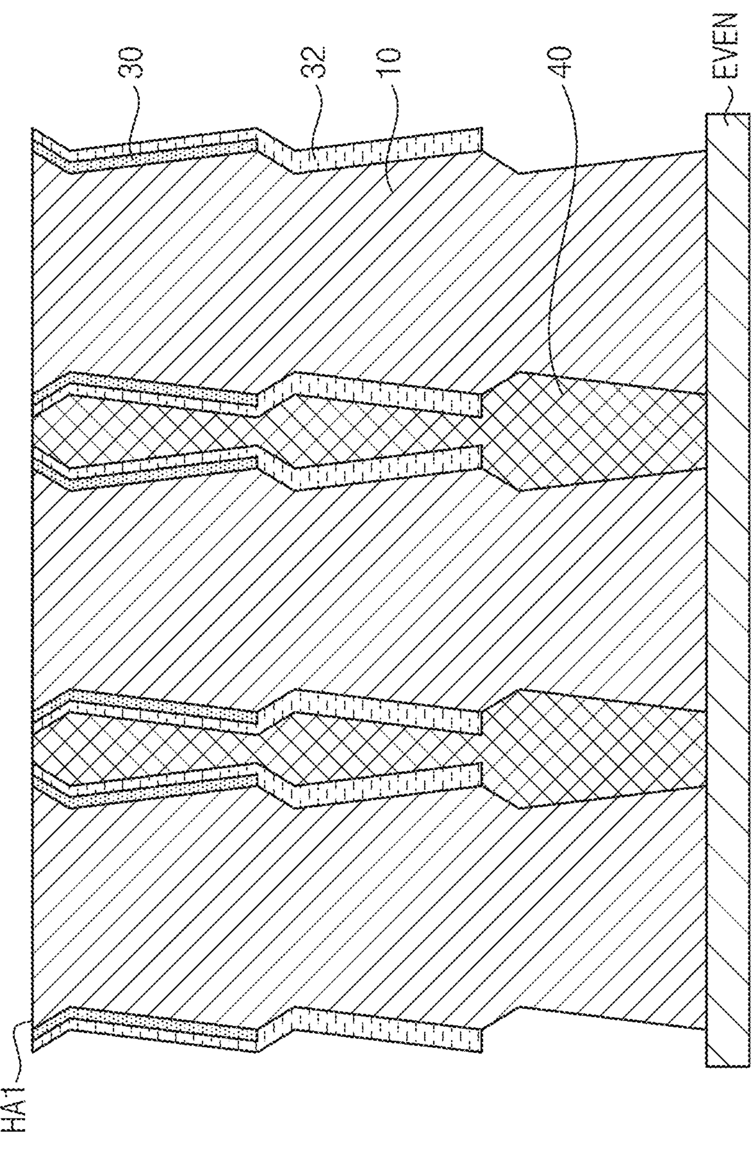

As shown in FIG. 20, the light blocking material (40) layer disposed on the top surface HA1 of the organic layer 10 may be removed (S720).

In an embodiment, the light blocking material (40) layer disposed on the top surface HA1 of the organic layer 10 may be removed to ensure the frontal transmittance. The light blocking material 40 may be removed in various schemes or manner. In an embodiment, for example, the light blocking material 40 may be removed through a polishing process such as chemical mechanical polishing (CMP) or the like, for example. However, the disclosure is not limited thereto.

A light may not be transmitted through a region where the light blocking material 40 is disposed, and may be transmitted through a region where the organic layer 10 is disposed. The light blocking material 40 disposed on the top surface HA1 of the organic layer 10 may be removed to further ensure a transmissive region. As the transmissive region becomes larger, the frontal transmittance may be further ensured or increased.

Figure 7:
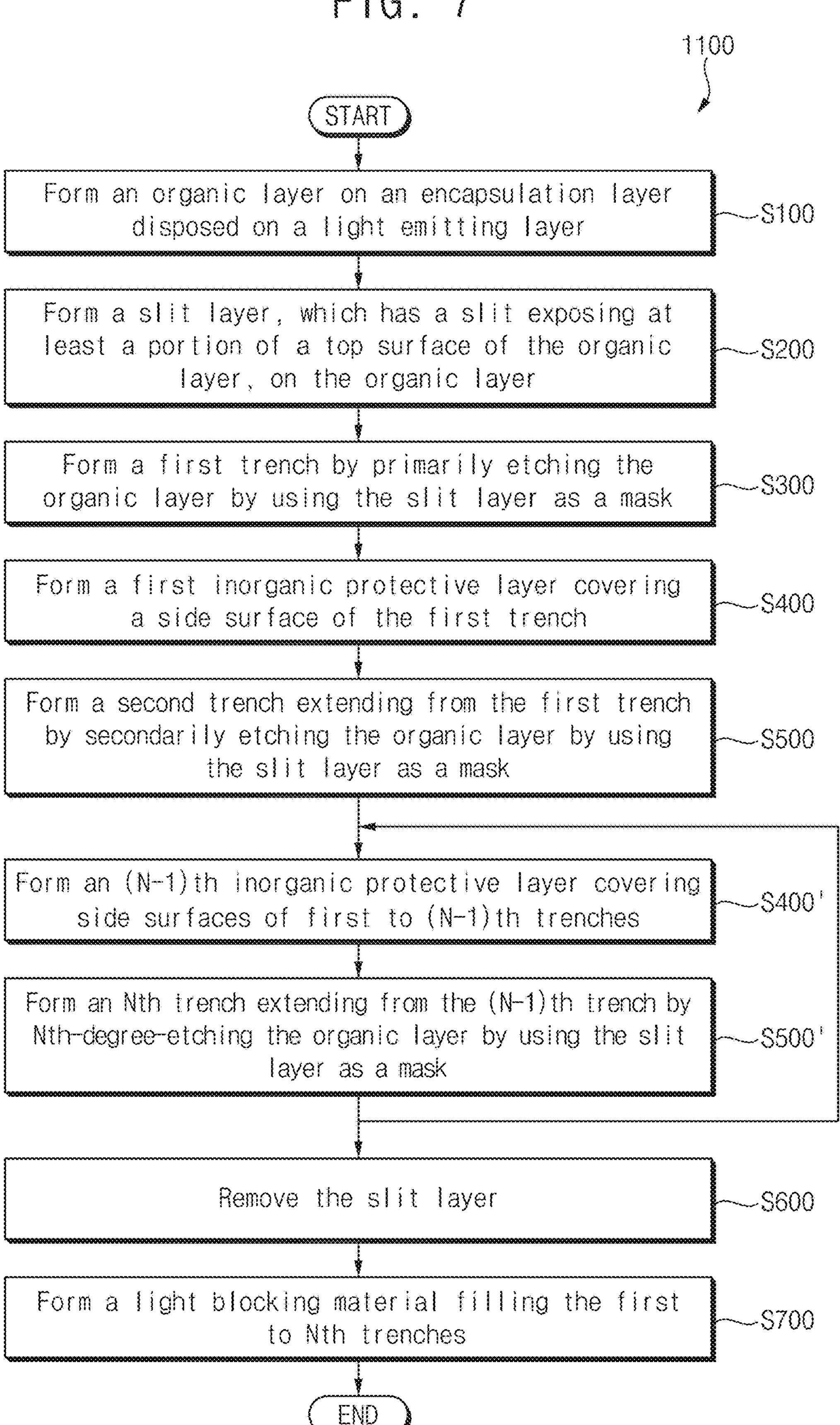
FIG. 7 is a flowchart for describing a method of manufacturing a display device according to an alternative embodiment of the disclosure.

FIG. 7 is a flowchart for describing a method of manufacturing a display device according to an alternative embodiment of the disclosure. FIGS. 8 to 20 are cross-cross-sectional views for describing the manufacturing method of FIG. 7.

Referring to FIG. 7, according to another embodiment of the disclosure, a method 1100 for manufacturing a display device may include: forming (or providing) an organic layer 10 on an encapsulation layer 300 disposed on a light emitting layer 200 (S100); forming a slit layer 20 with a slit S exposing at least a portion of a top surface of the organic layer 10 on the organic layer 10 (S200); forming a first trench P1 by primarily etching the organic layer 10 by using the slit layer 20 as a mask (S300); forming a first inorganic protective layer covering a side surface HB1 of the first trench P1 (S400); forming a second trench P2 extending from the first trench P1 by secondarily etching the organic layer 10 by using the slit layer 20 as a mask (S500); forming an $(N-1)^{th}$ inorganic protective layer 30' covering side surfaces of first to $(N-1)^{th}$ trenches P1 to PN−1, forming an $N^{th}$ trench PN extending from the $(N-1)^{th}$ trench PN−1 by $N^{th}$-degree-etching (by performing an $N^{th}$-degree-etching on) the organic layer 10 by using the slit layer 20 as a mask, where the forming of an additional inorganic protective layer 30' and the forming of an additional trench P3, P4, . . . or PN are repeatedly performed (N−2) times, respectively (S400' and S500'); removing the slit layer 20 (S600); and forming a light blocking material 40 filling the first to $N^{th}$ trenches P1 to PN. In such an embodiment, N may be a natural number that is greater than or equal to 3.

An embodiment of the method 1100 for manufacturing the display device that will be described with reference to FIGS. 7 to 20 may be substantially the same as the embodiment of the method 1000 for manufacturing the display device described with reference to FIGS. 3 to 6, FIGS. 8 to 14 and FIGS. 18 to 20 except that the forming of the additional inorganic protective layer 30' and the forming of the additional trench P3, P4, . . . or PN are repeatedly performed (N−2) times, respectively (S400' and S500'). Hereinafter, any repetitive detailed descriptions of the same or like elements as those described above will be omitted or simplified.

Referring to FIGS. 7 to 11, the organic layer may be formed on the encapsulation layer 300 disposed on the light emitting layer 200 (S100), and the slit layer 20 may be formed on the organic layer 10. The slit layer 20 may be provided with the slit S exposing at least the portion of the top surface of the organic layer 10 (S200). The first trench P1 may be formed by primarily etching the organic layer 10 by using the slit layer 20 as the mask (S300).

In an embodiment, the organic layer 10 may be formed on the encapsulation layer 300 disposed on the light emitting layer 200 (S100). In an embodiment, the organic layer 10 may be formed on the even layer EVEN. A thickness D101 of the organic layer 10 may be variously determined based on the frontal transmittance and the cut-off angle.

After the organic layer 10 is formed, a metal layer 21 may be formed (S210). A thickness D211 of the metal layer 21 may be greater than or equal to a predetermined thickness that allows the metal layer 21 to remain even after being subject to the multistage etching process. When the slit S is formed, both the dry etching process and the wet etching process may be used (S210). The slit layer 20 having slits S formed at a minute interval may be formed by the dry etching process. In an embodiment, a width of the slit S may be adjusted to prevent the moiré phenomenon.

The slit layer 20 may be formed (S200), and the first trench P1 may be formed by primarily etching the organic layer 10 (S300). The primary etching process may be the dry etching process. As the etching time increases, a critical value D301 and an etching depth D302 may be increased. Therefore, in order to ensure the frontal transmittance, the etching time may be set to be short. Accordingly, the critical value D301 may be prevented from being increased.

Referring to FIGS. 7 and 12 to 14, the first inorganic protective layer 30 covering the side surface HB1 of the first trench P1 may be formed (S400), and the second trench P2 extending from the first trench P1 may be formed by secondarily etching the organic layer 10 by using the slit layer 20 as the mask (S500).

After the primary etching, the first inorganic protective layer 30 covering the side surface HB1 of the first trench P1 may be formed. In an embodiment, the first inorganic protective layer 30 may include a transparent material to ensure the frontal transmittance. According to an embodiment, the first inorganic protective layer 30 may be formed after the even layer EVEN is formed, the first inorganic protective layer 30 may be formed of silicon nitride ($SiN_x$).

After the first inorganic protective layer 30 is formed, the organic layer 10 may be secondarily etched. In an embodiment, the side surface HB1 of the first trench P1 protected by the first inorganic protective layer 30 may not be etched. Referring to FIGS. 7 and 15 to 17, the $(N-1)^{th}$ inorganic protective layer covering the side surfaces of the first to $(N-1)^{th}$ trenches may be formed. Thereafter, the $N^{th}$ trench PN extending from the $(N-1)^{th}$ trench may be formed by $N^{th}$-degree-etching the organic layer 10 by using the slit layer 20 as the mask. In such an embodiment, the forming of the additional inorganic protective layer and the forming of the additional trench may be repeatedly performed (N−2) times, respectively (S400' and S500').

A preliminary $N^{th}$ inorganic protective layer may be formed to cover all of a top surface HA of the slit layer 20, side surfaces of the first to $N^{th}$ trenches, and a bottom surface of the $N^{th}$ trench. Next, only a portion of the preliminary $N^{th}$ inorganic protective layer may be removed by anisotropically dry-etching the preliminary $N^{th}$ inorganic protective layer. The removed portion of the preliminary $N^{th}$ inorganic protective layer may be a portion covering the top surface HA of the slit layer 20 and the bottom surface of the $N^{th}$ trench.

In an embodiment, for example, a preliminary second inorganic protective layer may be formed to cover all of the top surface HA of the slit layer 20, side surfaces HB1 and HB2 of the first and second trenches P1 and P2, and a bottom surface HC2 of the second trench P2 (S410'). Next, the portion of the preliminary second inorganic protective layer, which covers the top surface HA of the slit layer 20 and the bottom surface HC2 of the second trench P2, may be removed through the anisotropic dry etching (S420'). Accordingly, a second inorganic protective layer 32 covering the side surface HB2 of the second trench P2 may be formed. The second inorganic protective layer 32 may cover the side surface HB1 of the first trench P1 and the side surface HB2 of the second trench P2. In an embodiment, the second inorganic protective layer 32 may include a transparent insulating material to ensure the frontal transmittance.

Figure 17:
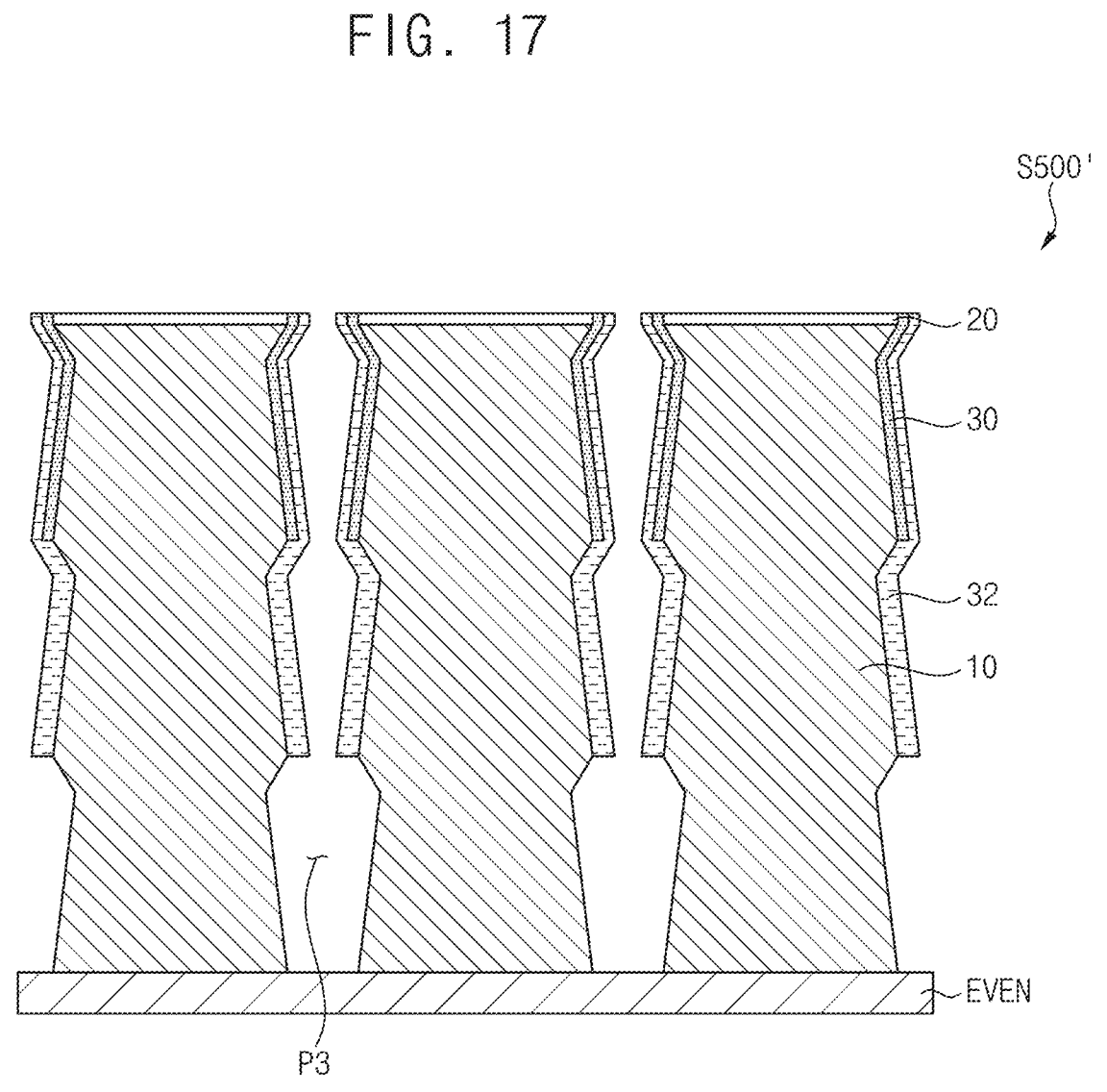

Referring to FIG. 17, a third trench P3 may be formed by tertiarily etching the organic layer 10 (S500'). In this case, the second inorganic protective layer 32 may be used as a protective layer during the tertiary etching process. In such an embodiment, the second inorganic protective layer 32 may cover the side surface HB1 of the first trench P1 and the side surface HB2 of the second trench P2 to prevent a critical value CD of the trench from being increased.

The multistage etching process of repeatedly performing the above process may be performed. Since the critical value CD may become smaller as the etching time decreases, the etching process may be repeatedly performed multiple times within a short time. In such an embodiment, an etching process of the organic layer 10 may be performed after forming an inorganic protective layer to prevent the critical value CD from being increased.

The first inorganic protective layer 30 to the $N^{th}$ inorganic protective layer may include different materials from each other. The first inorganic protective layer 30 to the $N^{th}$ inorganic protective layer may include different materials from each other in consideration of an etching time, an etching rate, a cost, or the like. However, the disclosure is not limited thereto.

Each of the first inorganic protective layer 30 to the $N^{th}$ inorganic protective layer may include a transparent material. Each of the first inorganic protective layer 30 to the $N^{th}$ inorganic protective layer 30' and the organic layer 10 may transmit a light. In an embodiment, a light may not be transmitted through a region where the light blocking material 40 is disposed, and may be transmitted through a region where the organic layer 10 and the first inorganic protective layer 30 to the $N^{th}$ inorganic protective layer are disposed. The first inorganic protective layer 30 to the $N^{th}$ inorganic protective layer may have different thicknesses from each other. In an embodiment, for example, a primary etching time may be greater than a secondary etching time. In such an embodiment, a thickness of the second inorganic protective layer 32 (e.g., a thickness D411 of the second inorganic protective layer 32 of FIG. 15) may be less than a thickness of the first inorganic protective layer 30 (e.g., a thickness D401 of the first inorganic protective layer 30 of FIG. 12). The thickness of the second inorganic protective layer 32 may be greater than or equal to a predetermined thickness that allows the second inorganic protective layer 32 to remain after being subject to the etching process of the organic layer 10.

Figure 15:
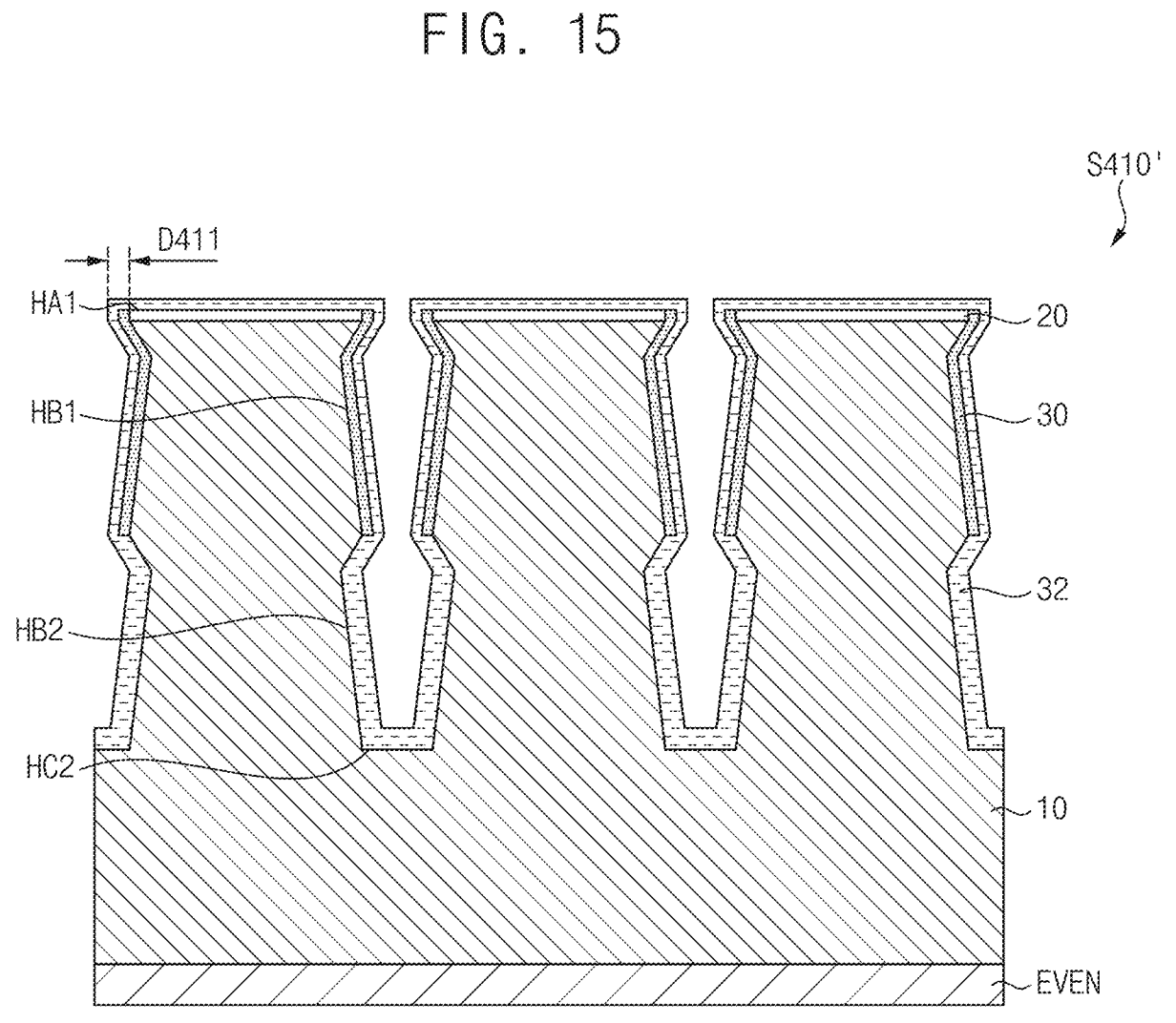
Figure 16:
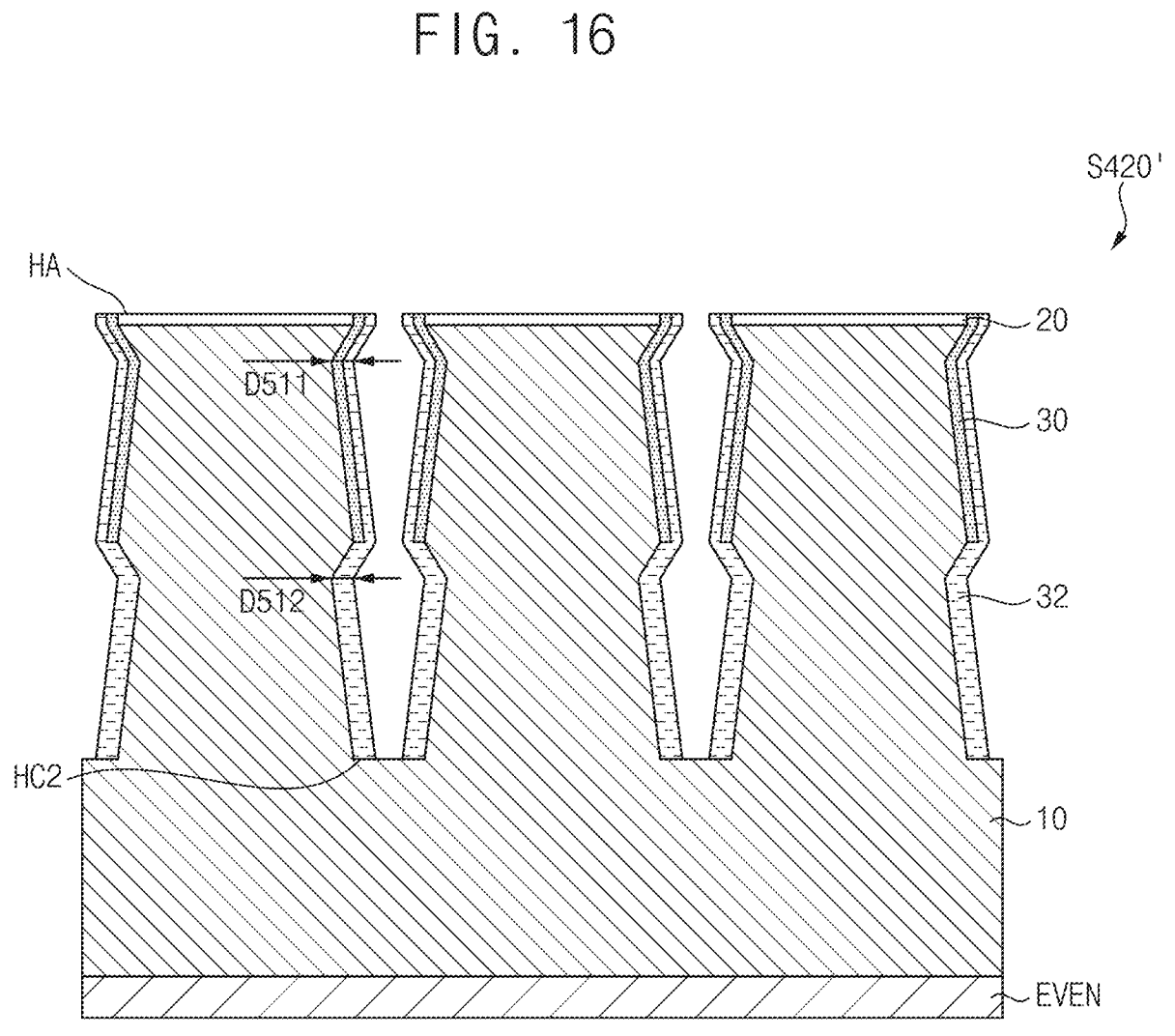

As shown in FIGS. 15 and 16, the first inorganic protective layer 30 and the second inorganic protective layer 32 may be disposed on the side surface HB1 of the first trench P1. Only the second inorganic protective layer 32 may be disposed on the side surface HB2 of the second trench P2. The second inorganic protective layer 32 may have a second thickness D512. Accordingly, the side surface HB1 of the first trench P1 may have a first thickness D511 that is thicker than the second thickness D512. However, the disclosure is not limited thereto.

As described above, the $N^{th}$ trench PN may be etched to have an $N^{th}$ height. In this case, N may be a natural number that is greater than or equal to 1. According to an embodiment, various viewing angles may be ensured by adjusting first to $N^{th}$ heights of the first to $N^{th}$ trench PN. According to an alternative embodiment, the first to $N^{th}$ heights of the first to $N^{th}$ trench PN may be equal to each other.

As the etching depth (e.g., the etching depth DEP of FIG. 2) and the critical value (e.g., the critical value CD of FIG. 2) decrease, the frontal transmittance may be improved. Therefore, the etching time may be adjusted to perform etching multiple times so that trenches having the same height may be formed. Accordingly, the frontal transmittance may be improved. However, the disclosure is not limited thereto.

Referring to FIGS. 7 and 18 to 20, the slit layer 20 may be removed (S600), and the light blocking material 40 filling the first to $N^{th}$ trenches may be formed (S700). First, after the light blocking material 40 is applied onto the organic layer 10 to fill the first to $N^{th}$ trenches, (a portion of) a light blocking material (40) layer disposed on the organic layer 10 may be removed.

An amount of a portion of the light blocking material 40 filled in the first trench P1 may be the largest among amounts of portions of the light blocking material 40 filled in the first to $N^{th}$ trenches, respectively. Accordingly, the frontal transmittance of the display device may be improved.

In an embodiment, for example, where N is 3, the light blocking material 40 filling the first to third trenches P1, P2, and P3 may be applied (S710), and the light blocking material (40) layer disposed on the organic layer 10 may be removed (S720). In such an embodiment, the amounts of the light blocking material 40 filled in the trenches, respectively, may be decreased from the first trench P1 toward the third trench P3. However, the disclosure is not limited thereto.

As described above, before the removing of the slit layer 20 (S600), coating of a material capable of selectively etching the organic layer 10 may be performed, and the organic layer 10 may be etched in multiple stages. As the etching time becomes shorter, the critical value CD may be minimized. Therefore, the etching may be repeatedly performed multiple times within a short time. In an embodiment, an inorganic protective layer covering a side surface of the trench may be formed to prevent a critical value CD of a trench formed in a previous etching process from being increased, and the etching process of the organic layer 10 may be performed. Accordingly, a space filled with the light blocking material 40 may be reduced, so that the frontal transmittance may be ensured.

Figure 21:
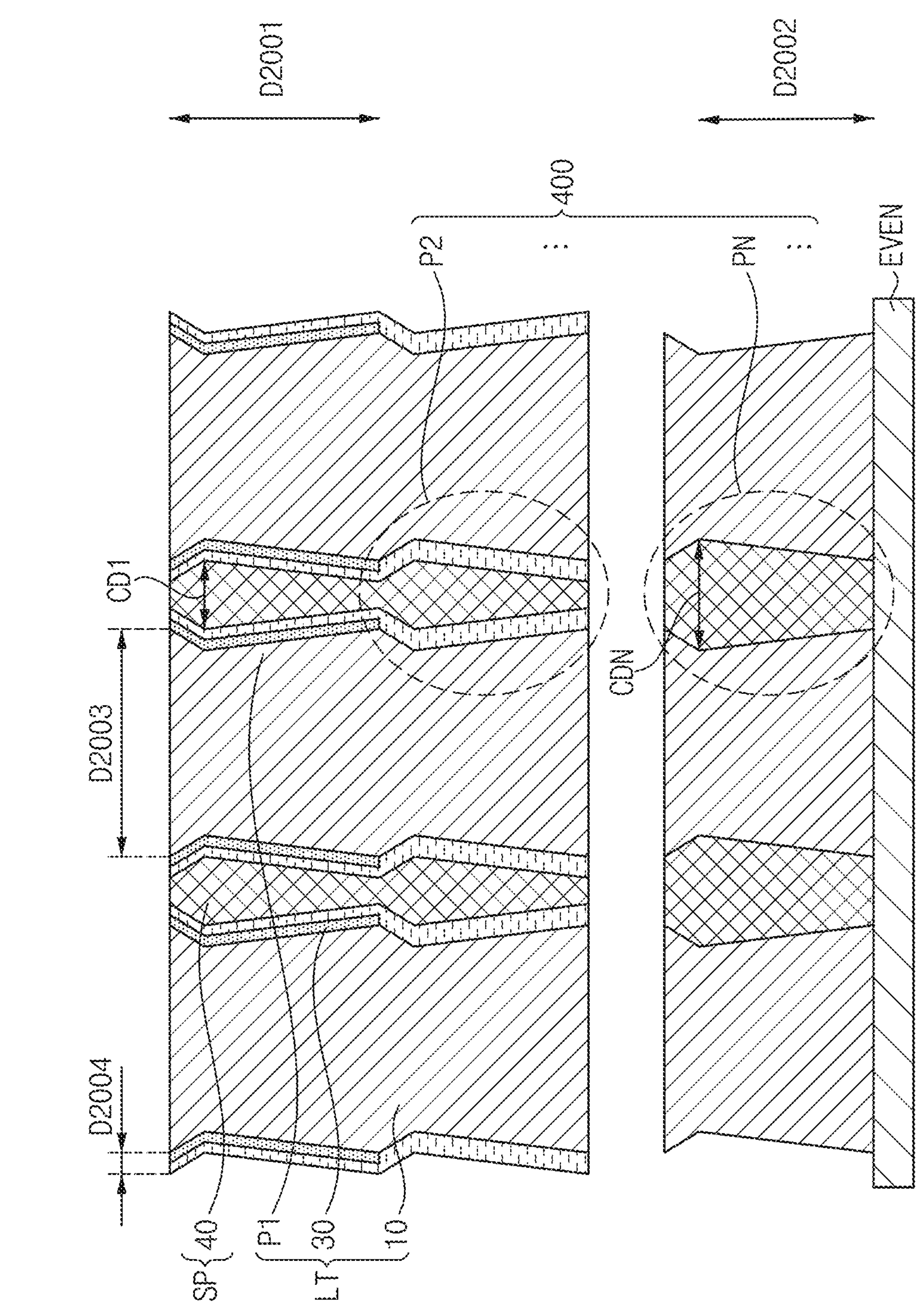
FIG. 21 is a cross-sectional view for describing a display device according to an embodiment of the disclosure.

FIG. 21 is a cross-sectional view for describing a display device according to an embodiment of the disclosure.

An embodiment of a display device 2000 that will be described with reference to FIG. 21 may be manufactured by an embodiment of the method 1000 or 1100 for manufacturing the display device described above with reference to FIGS. 3 to 20. Therefore, any repetitive detailed description of the same or like elements of the display device 2000 of FIG. 21 as those described above will hereinafter be omitted or simplified.

In an embodiment where the display device 2000 is disposed in a vehicle, the display device 2000 may obstruct a field of vision of a driver when a viewing angle of the display device 2000 is wide. In particular, when driving at night, an image of the display device 2000 may be reflected by a windshield of the vehicle, which may distract the driver from the driving.

In addition, when the viewing angle of the display device 2000 such as a portable terminal is wide, a person other than a user may view the image of the display device 2000, which may cause privacy issues.

Referring to FIGS. 2 and 21, according to an embodiment of the disclosure, the display device 2000 may include: an encapsulation layer 300 disposed on a light emitting layer 200; and a light blocking pattern 400 disposed on the encapsulation layer 300.

The light blocking pattern 400 may include an organic layer 10, a light blocking material 40, and an inorganic protective layer. The organic layer 10 may be disposed on the encapsulation layer 300. The light blocking material 40 may be located between organic layers 10. The inorganic protective layer may be disposed between at least a portion of a side surface of the organic layer 10 defining a trench and the light blocking material 40.

The light blocking pattern 400 may be disposed or filled in the trench. The trench may include a first trench P1 and a second trench P2. The first trench P1 may be formed in a direction from a top surface of the organic layer 10 toward the encapsulation layer 300. The second trench P2 may extend from the first trench P1. The second trench P2 may be formed in the direction from the top surface of the organic layer 10 toward the encapsulation layer 300.

The inorganic protective layer may include a first inorganic protective layer 30 and a second inorganic protective layer 32. The first inorganic protective layer 30 may be disposed between the first trench P1 and the light blocking material 40. The second inorganic protective layer 32 may be disposed between the first inorganic protective layer 30 and the light blocking material 40. In addition, the second inorganic protective layer 32 may be disposed between the second trench P2 and the light blocking material 40.

The light blocking pattern 400 may be integrated inside the display device 2000. Accordingly, the viewing angle may be limited.

A filling amount of the light blocking material 40 may be determined based on critical values CD1 to CDN of trenches. According to an embodiment, a first critical value CD1 of the first trench P1 may be the largest, and an $N^{th}$ critical value CDN of an $N^{th}$ trench PN may be the smallest. Accordingly, a frontal transmittance of the display device 2000 may be improved.

The trenches defined by the light blocking pattern 400 may have different heights from each other. According to an embodiment, a height D2001 of the first trench P1 and a height D2002 of the $N^{th}$ trench PN that is adjacent to the encapsulation layer 300 may be different from each other. The height of each of the trenches may be adjusted to prevent the moiré phenomenon.

Light blocking pattern 400 may have a thickness variously determined depending on positions thereof in a display device 2000. According to an embodiment, the height of the light blocking pattern 400 may be greater than or equal to about 10 μm, and less than or equal to about 40 μm. Accordingly, a thickness of the display device 2000 may become thinner.

The light blocking pattern 400 may include a transmissive part LT and a light blocking part SP.

The transmissive part LT may include the organic layer 10 and the inorganic protective layer. The organic layer 10 and the inorganic protective layer may include a transparent material. Accordingly, a light emitted from the light emitting layer 200 may be transmitted.

The light blocking part SP may include the light blocking material 40. Accordingly, the light emitted from the light emitting layer 200 may be absorbed.

In an embodiment, the critical values CD1 to CDN may be minimized, and a thickness D2003 of the organic layer 10 and a thickness D2004 of the inorganic protective layer may be maximized to ensure the frontal transmittance together with a viewing angle blocking effect. In an embodiment, the critical values may be minimized through the multistage etching scheme described above.

Embodiments of the disclosure can be applied to a display device and an electronic device including the display device such as high-resolution smartphones, mobile phones, smart-pads, smart watches, tablet personal computers (PCs), in-vehicle navigation systems, televisions, computer monitors, notebook, computers, or the like, for example.

The invention should not be construed as being limited to the embodiments set forth herein. Rather, these embodiments are provided so that this disclosure will be thorough and complete and will fully convey the concept of the invention to those skilled in the art While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display device, the method comprising:

forming an organic layer on an encapsulation layer disposed on a light emitting layer;

forming a slit layer on the organic layer, wherein a slit exposing at least a portion of a top surface of the organic layer is formed in the slit layer;

forming a first trench by performing a primary etching on the organic layer using the slit layer as a mask;

forming a first inorganic protective layer covering a side surface of the first trench;

forming a second trench extending from the first trench by performing a secondary etching on the organic layer by using the slit layer as a mask; and forming a light blocking material filling the first trench and the second trench.

2. The method of claim 1, wherein a thickness of the organic layer is less than or equal to about 50 μm.

3. The method of claim 1, wherein the forming the slit layer includes:

applying a metal layer on the organic layer; and forming the slit by performing a dry-etching a portion of the metal layer.

4. The method of claim 3, wherein the metal layer includes aluminum.

5. The method of claim 1, wherein each of the primary etching and the secondary etching is a dry etching.

6. The method of claim 1, wherein the forming the first inorganic protective layer includes:

forming a preliminary first inorganic protective layer on the organic layer, on which the primary etching is performed, to cover a top surface of the slit layer, the side surface of the first trench and a bottom surface of the first trench; and removing a portion of the preliminary first inorganic protective layer, which covers the top surface of the slit layer and the bottom surface of the first trench, by performing an anisotropic dry-etching on the preliminary first inorganic protective layer.

7. The method of claim 6, wherein the first inorganic protective layer includes a transparent material.

8. The method of claim 1, wherein a height of the first trench is different from a height of the second trench.

9. The method of claim 8, wherein the height of the first trench is greater than the height of the second trench.

10. The method of claim 1, further comprising:

removing the slit layer before the forming the light blocking material.

11. The method of claim 1, wherein the forming the light blocking material includes:

applying a light blocking material layer on the organic layer to fill the first trench and the second trench; and removing a portion of the light blocking material layer disposed on a top surface of the organic layer.

12. A method of manufacturing a display device, the method comprising:

forming an organic layer on an encapsulation layer disposed on a light emitting layer;

forming a slit layer on the organic layer, wherein a slit exposing at least a portion of a top surface of the organic layer is formed in the slit layer;

forming a first trench by performing a primary etching on the organic layer by using the slit layer as a mask;

forming a first inorganic protective layer covering a side surface of the first trench;

forming a second trench extending from the first trench by performing a secondary etching on the organic layer by using the slit layer as a mask;

forming an $(N-1)^{th}$ inorganic protective layer covering side surfaces of first to $(N-1)^{th}$ trenches, forming an $N^{th}$ trench extending from the $(N-1)^{th}$ trench by performing an $N^{th}$-degree-etching on the organic layer by using the slit layer as a mask, wherein forming an additional inorganic protective layer and forming an additional trench are repeatedly performed (N−2) times, respectively, and N is a natural number that is greater than or equal to 3; and forming a light blocking material filling the first to $N^{th}$ trenches.

13. The method of claim 12, wherein after the forming the $N^{th}$ trench, the method further comprises:

removing the slit layer;

applying a light blocking material layer onto the organic layer to fill the first to $N^{th}$ trenches; and removing a portion of the light blocking material layer disposed on a top surface of the organic layer.

14. The method of claim 13, wherein the first inorganic protective layer and the $(N-1)^{th}$ inorganic protective layer include different materials from each other.

15. The method of claim 14, wherein each of the first to $(N-1)^{th}$ inorganic protective layers includes a transparent material.

16. The method of claim 12, wherein an amount of a portion of the light blocking material filled in the first trench is the largest among amounts of portions of the light blocking material filled in the first to $N^{th}$ trenches, respectively.

* * * * *